(12) United States Patent
Lawrence

(10) Patent No.: US 10,599,795 B2
(45) Date of Patent: Mar. 24, 2020

(54) COMPUTER ARCHITECTURE FOR EMULATING A BINARY CORRELITHM OBJECT FLIP FLOP

(71) Applicant: BANK OF AMERICA CORPORATION, Charlotte, NC (US)

(72) Inventor: Patrick N. Lawrence, Plano, TX (US)

(73) Assignee: BANK OF AMERICA CORPORATION, Charlotte, NC (US)

(*) Notice: Subject to any disclaimer, the term of this patent is extended or adjusted under 35 U.S.C. 154(b) by 372 days.

(21) Appl. No.: 15/783,572

(22) Filed: Oct. 13, 2017

(65) Prior Publication Data

US 2019/0114378 A1 Apr. 18, 2019

(51) Int. Cl.
| | | |
|---|---|---|
| G06F 9/30 | (2018.01) | |
| G06F 17/50 | (2006.01) | |
| G06F 9/455 | (2018.01) | |
| G06F 16/00 | (2019.01) | |
| G06K 9/62 | (2006.01) | |

(52) U.S. Cl.
CPC ...... *G06F 17/5027* (2013.01); *G06F 9/30029* (2013.01); *G06F 9/455* (2013.01); *G06F 9/45508* (2013.01); *G06F 16/00* (2019.01); *G06K 9/6215* (2013.01)

(58) Field of Classification Search
None
See application file for complete search history.

(56) References Cited

U.S. PATENT DOCUMENTS

| | | | |
|---|---|---|---|
| 3,381,095 A * | 4/1968 | Baker | H04Q 3/54 379/209.01 |
| 5,946,673 A | 8/1999 | Francone et al. | |
| 6,167,391 A * | 12/2000 | Lawrence | G06N 3/10 706/26 |
| 6,941,287 B1 | 9/2005 | Vaidyanathan et al. | |
| 6,943,686 B2 | 9/2005 | Allen | |
| 6,947,913 B1 * | 9/2005 | Lawrence | G06N 20/00 706/14 |
| 7,015,835 B2 * | 3/2006 | Lawrence | H03M 7/00 341/50 |
| 7,031,969 B2 * | 4/2006 | Lawrence | G06F 16/313 |
| 7,246,129 B2 | 7/2007 | Lawrence et al. | |
| 7,310,622 B2 * | 12/2007 | Lawrence | G06N 10/00 706/14 |

(Continued)

OTHER PUBLICATIONS

Lawrence, P. N., "Computer Architecture For Emulating A Correlithm Object Logic Gate Using A Context Input," U.S. Appl. No. 15/783,470, filed Oct. 13, 2017, 64 pages.

(Continued)

*Primary Examiner* — Kibrom K Gebresilassie
(74) *Attorney, Agent, or Firm* — Michael A. Springs

(57) ABSTRACT

A device configured to emulate a correlithm object flip-flip logic gate comprises a memory and a logic engine. The memory stores a flip-flop logic gate truth table that comprises input logical values, a state input logical value, a set/reset input logical value, and output logical values. These logical values are represented by correlithm objects. The logic engine receives the state input and the set/reset inputs and determines an appropriate output based on a determination of Hamming distances between the inputs and the logical values in the truth table.

20 Claims, 10 Drawing Sheets

(56) References Cited

U.S. PATENT DOCUMENTS

| | | | |
|---|---|---|---|
| 7,349,928 B2 | 3/2008 | Lawrence et al. | |
| 10,037,478 B1* | 7/2018 | Lawrence | G06K 9/6298 |
| 10,467,499 B2* | 11/2019 | Lawrence | G06K 9/00973 |
| 10,481,930 B1* | 11/2019 | Lawrence | G06F 9/45504 |
| 2004/0208315 A1* | 10/2004 | Kilbank | H03M 7/30 380/37 |

OTHER PUBLICATIONS

Lawrence, P. N., "Computer Architecture For Emulating A Unary Correlithm Object Logic Gate," U.S. Appl. No. 15/783,738, filed Oct. 13, 2017, 62 pages.

Lawrence, P. N., "Computer Architecture For Emulating A Binary Correlithm Object Logic Gate," U.S. Appl. No. 15/783,785, filed Oct. 13, 2017, 64 pages.

Meersman, R. et al., "On the Move to Meaningful Internet Systems 2005: CoopIS, DOA and ODBASE," OTM Confederated International Conferences CoopIS, DOA and ODBASE Oct. 2005 Agia Napa, Cyprus, Proceedings, Part I, Oct. 31-Nov. 4, 2005, pp. 763-779.

Lawrence, P. N., Correlithm Object Technology, Apr. 2004, 229 pages.

* cited by examiner

COMPUTER ARCHITECTURE FOR EMULATING A BINARY CORRELITHM OBJECT FLIP FLOP

TECHNICAL FIELD

The present disclosure relates generally to computer architectures for emulating a processing system, and more specifically to computer architectures for emulating a binary correlithm object flip flop.

BACKGROUND

Conventional computers are highly attuned to using operations that require manipulating ordinal numbers, especially ordinal binary integers. The value of an ordinal number corresponds with its position in a set of sequentially ordered number values. These computers use ordinal binary integers to represent, manipulate, and store information. These computers rely on the numerical order of ordinal binary integers representing data to perform various operations such as counting, sorting, indexing, and mathematical calculations. Even when performing operations that involve other number systems (e.g. floating point), conventional computers still resort to using ordinal binary integers to perform any operations.

Ordinal based number systems only provide information about the sequence order of the numbers themselves based on their numeric values. Ordinal numbers do not provide any information about any other types of relationships for the data being represented by the numeric values such as similarity. For example, when a conventional computer uses ordinal numbers to represent data samples (e.g. images or audio signals), different data samples are represented by different numeric values. The different numeric values do not provide any information about how similar or dissimilar one data sample is from another. Unless there is an exact match in ordinal number values, conventional systems are unable to tell if a data sample matches or is similar to any other data samples. As a result, conventional computers are unable to use ordinal numbers by themselves for comparing different data samples and instead these computers rely on complex signal processing techniques. Determining whether a data sample matches or is similar to other data samples is not a trivial task and poses several technical challenges for conventional computers. These technical challenges result in complex processes that consume processing power which reduces the speed and performance of the system. The ability to compare unknown data samples to known data samples is crucial for many security applications such as face recognition, voice recognition, and fraud detection.

Thus, it is desirable to provide a solution that allows computing systems to efficiently determine how similar different data samples are to each other and to perform operations based on their similarity.

SUMMARY

Conventional computers are highly attuned to using operations that require manipulating ordinal numbers, especially ordinal binary integers. The value of an ordinal number corresponds with its position in an set of sequentially ordered number values. These computers use ordinal binary integers to represent, manipulate, and store information. These computers rely on the numerical order of ordinal binary integers representing data to perform various operations such as counting, sorting, indexing, and mathematical calculations. Even when performing operations that involve other number systems (e.g. floating point), conventional computers still resort to using ordinal binary integers to perform any operations.

Ordinal based number systems only provide information about the sequence order of the numbers themselves based on their numeric values. Ordinal numbers do not provide any information about any other types of relationships for the data being represented by the numeric values such as similarity. For example, when a conventional computer uses ordinal numbers to represent data samples (e.g. images or audio signals), different data samples are represented by different numeric values. The different numeric values do not provide any information about how similar or dissimilar one data sample is from another. Unless there is an exact match in ordinal number values, conventional systems are unable to tell if a data sample matches or is similar to any other data samples. As a result, conventional computers are unable to use ordinal numbers by themselves for comparing different data samples and instead these computers rely on complex signal processing techniques. Determining whether a data sample matches or is similar to other data samples is not a trivial task and poses several technical challenges for conventional computers. These technical challenges result in complex processes that consume processing power which reduces the speed and performance of the system. The ability to compare unknown data samples to known data samples is crucial for many applications such as security application (e.g. face recognition, voice recognition, and fraud detection).

The system described in the present application provides a technical solution that enables the system to efficiently determine how similar different objects are to each other and to perform operations based on their similarity. In contrast to conventional systems, the system uses an unconventional configuration to perform various operations using categorical numbers and geometric objects, also referred to as correlithm objects, instead of ordinal numbers. Using categorical numbers and correlithm objects on a conventional device involves changing the traditional operation of the computer to support representing and manipulating concepts as correlithm objects. A device or system may be configured to implement or emulate a special purpose computing device capable of performing operations using correlithm objects. Implementing or emulating a correlithm object processing system improves the operation of a device by enabling the device to perform non-binary comparisons (i.e. match or no match) between different data samples. This enables the device to quantify a degree of similarity between different data samples. This increases the flexibility of the device to work with data samples having different data types and/or formats, and also increases the speed and performance of the device when performing operations using data samples. These technical advantages and other improvements to the device are described in more detail throughout the disclosure.

In one embodiment, the system is configured to use binary integers as categorical numbers rather than ordinal numbers which enables the system to determine how similar a data sample is to other data samples. Categorical numbers provide information about similar or dissimilar different data samples are from each other. For example, categorical numbers can be used in facial recognition applications to represent different images of faces and/or features of the faces. The system provides a technical advantage by allowing the system to assign correlithm objects represented by categorical numbers to different data samples based on how similar they are to other data samples. As an example, the system is able to assign correlithm objects to different images of people such that the correlithm objects can be directly used to determine how similar the people in the images are to each other. In other words, the system is able to use correlithm objects in facial recognition applications to quickly determine whether a captured image of a person matches any previously stored images without relying on conventional signal processing techniques.

Correlithm object processing systems use new types of data structures called correlithm objects that improve the way a device operates, for example, by enabling the device to perform non-binary data set comparisons and to quantify the similarity between different data samples. Correlithm objects are data structures designed to improve the way a device stores, retrieves, and compares data samples in memory. Correlithm objects also provide a data structure that is independent of the data type and format of the data samples they represent. Correlithm objects allow data samples to be directly compared regardless of their original data type and/or format.

A correlithm object processing system uses a combination of a sensor table, a node table, and/or an actor table to provide a specific set of rules that improve computer-related technologies by enabling devices to compare and to determine the degree of similarity between different data samples regardless of the data type and/or format of the data sample they represent. The ability to directly compare data samples having different data types and/or formatting is a new functionality that cannot be performed using conventional computing systems and data structures.

In addition, correlithm object processing system uses a combination of a sensor table, a node table, and/or an actor table to provide a particular manner for transforming data samples between ordinal number representations and correlithm objects in a correlithm object domain. Transforming data samples between ordinal number representations and correlithm objects involves fundamentally changing the data type of data samples between an ordinal number system and a categorical number system to achieve the previously described benefits of the correlithm object processing system.

Using correlithm objects allows the system or device to compare data samples (e.g. images) even when the input data sample does not exactly match any known or previously stored input values. For example, an input data sample that is an image may have different lighting conditions than the previously stored images. The differences in lighting conditions can make images of the same person appear different from each other. The device uses an unconventional configuration that implements a correlithm object processing system that uses the distance between the data samples which are represented as correlithm objects and other known data samples to determine whether the input data sample matches or is similar to the other known data samples. Implementing a correlithm object processing system fundamentally changes the device and the traditional data processing paradigm. Implementing the correlithm object processing system improves the operation of the device by enabling the device to perform non-binary comparisons of data samples. In other words, the device is able to determine how similar the data samples are to each other even when the data samples are not exact matches. In addition, the device is able to quantify how similar data samples are to one another. The ability to determine how similar data samples are to each others is unique and distinct from conventional computers that can only perform binary comparisons to identify exact matches.

The problems associated with comparing data sets and identifying matches based on the comparison are problems necessarily rooted in computer technologies. As described above, conventional systems are limited to a binary comparison that can only determine whether an exact match is found. Emulating a correlithm object processing system provides a technical solution that addresses problems associated with comparing data sets and identifying matches. Using correlithm objects to represent data samples fundamentally changes the operation of a device and how the device views data samples. By implementing a correlithm object processing system, the device can determine the distance between the data samples and other known data samples to determine whether the input data sample matches or is similar to the other known data samples. In addition, the device is able to determine a degree of similarity that quantifies how similar different data samples are to one another.

In conventional electronic and computer systems, digital circuits represent a single state using two logic levels. These levels are referred to, for example, as a logic 1 or a logic 0, HIGH or LOW, True or False, or ON or OFF. Most logic systems use positive logic, in which case a logic "0" is represented by zero volts and a logic "1" is represented by a higher voltage, such as +5 volts. The two discrete voltage levels representing the digital values of "1's" (one's) and "0's" (zero's) are commonly called: BInary digiTS, and in digital and computational circuits and applications they are normally referred to as binary BITS.

Conventional electronic and computer circuits exhibit some small level of noise. Thus, a noise margin is built around the zero volt representation of a logic "0" and around a +5 volt representation of logic "1" to allow the system to accurately represent a logic 0 or 1 even if the voltage levels are not exactly zero or +5 volts. However, voltage surges associated with electromagnetic pulses (EMPs) or other significant forms of noise can alter the representation of these binary BITS in a conventional digital computer system. For example, a voltage surge can exceed the noise margins built around logic "0" and "1" such that a BIT value of "0" may be mispresented as a value of "1," and a BIT value of "1" may be misrepresented as a value of "0." Thus, voltage surge can cause conventional electronic and computer circuits to malfunction.

The present disclosure describes representing logical "0's" and "1's" (or High/Low; True/False; On/Off) using correlithm objects which exhibit immunity to these significant noise impulses. Although the examples below are described in terms of logical "0's" and logical "1's," one of skill in the art will understand that any binary values (e.g., High/Low; True/False; On/Off; etc.) can be used to represent these logical values. As a result of using correlithm objects to represent these logical values, any electrical or computer system built using correlithm objects to represent binary values is more robust and hardened against voltage surges and other forms of significant noise, such as EMP impulses. For example, when a logical "0" is represented by a correlithm object in n-dimensional space (e.g., a correlithm object in 64-dimensional space comprising a 64-bit value to represent a logical "0"), an EMP noise impulse may affect a few bits (e.g., up to five bits) of the 64-bit correlithm object. However, the remaining bits (e.g., up to sixty bits) of the 64-bit correlithm object would remain intact and collectively would still represent a logical "0." Similarly, when a logical "1" is represented by a correlithm object in n-dimensional space (e.g., a correlithm object in 64-dimensional space comprising a 64-bit value to represent a logical "1"), an EMP noise impulse may affect a few bits (e.g., up to five bits) of the 64 bit correlithm object. However, the remaining bits (e.g., up to sixty bits) of the 64-bit correlithm object would remain intact and collectively would still represent a logical "1." In other words, because the logical "0" or logical "1" is represented in n-dimensional space using a correlithm object, even if the values of some of the bits of the correlithm object were affected by significant noise, the remaining bits would adequately represent the original logical value.

Therefore, correlithm objects can be used to emulate logical values and logical functions with a robustness and immunity to noise that is not available in conventional computer systems. In at least this way, the use of correlithm objects to emulate logical values and logical functions improves the operation of a computer itself.

Certain embodiments of the present disclosure may include some, all, or none of these advantages. These advantages and other features will be more clearly understood from the following detailed description taken in conjunction with the accompanying drawings and claims.

BRIEF DESCRIPTION OF THE DRAWINGS

For a more complete understanding of this disclosure, reference is now made to the following brief description, taken in connection with the accompanying drawings and detailed description, wherein like reference numerals represent like parts.

DETAILED DESCRIPTION

FIGS. 1-5 describe various embodiments of how a correlithm object processing system may be implemented or emulated in hardware, such as a special purpose computer. FIGS. 6-10 describe various embodiments of using correlithm objects to emulate logic gates.

Figure 1:
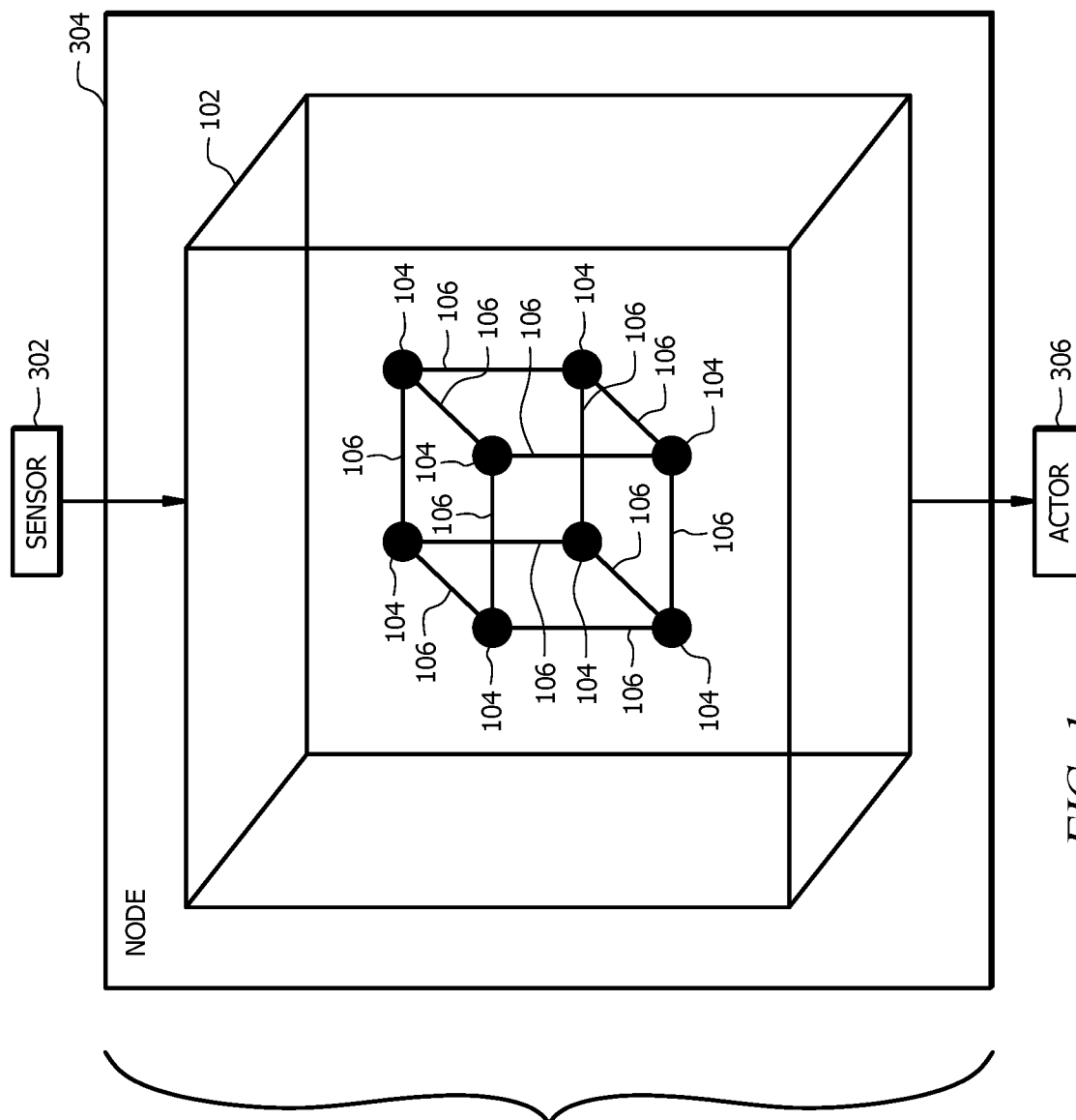
FIG. 1 is a schematic view of an embodiment of a special purpose computer implementing correlithm objects in an n-dimensional space.
Figure 1:
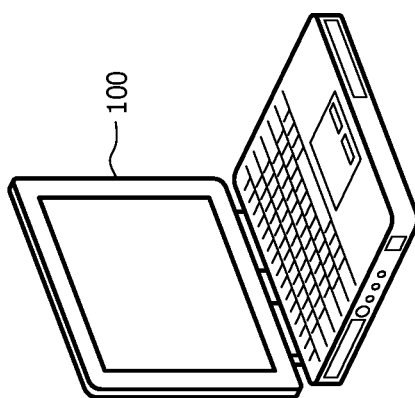

FIG. 1 is a schematic view of an embodiment of a user device 100 implementing correlithm objects 104 in an n-dimensional space 102. Examples of user devices 100 include, but are not limited to, desktop computers, mobile phones, tablet computers, laptop computers, or other special purpose computer platform. The user device 100 is configured to implement or emulate a correlithm object processing system that uses categorical numbers to represent data samples as correlithm objects 104 in a high-dimensional space 102, for example a high-dimensional binary cube. Additional information about the correlithm object processing system is described in FIG. 3. Additional information about configuring the user device 100 to implement or emulate a correlithm object processing system is described in FIG. 5.

Conventional computers rely on the numerical order of ordinal binary integers representing data to perform various operations such as counting, sorting, indexing, and mathematical calculations. Even when performing operations that involve other number systems (e.g. floating point), conventional computers still resort to using ordinal binary integers to perform any operations. Ordinal based number systems only provide information about the sequence order of the numbers themselves based on their numeric values. Ordinal numbers do not provide any information about any other types of relationships for the data being represented by the numeric values, such as similarity. For example, when a conventional computer uses ordinal numbers to represent data samples (e.g. images or audio signals), different data samples are represented by different numeric values. The different numeric values do not provide any information about how similar or dissimilar one data sample is from another. In other words, conventional computers are only able to make binary comparisons of data samples which only results in determining whether the data samples match or do not match. Unless there is an exact match in ordinal number values, conventional systems are unable to tell if a data sample matches or is similar to any other data samples. As a result, conventional computers are unable to use ordinal numbers by themselves for determining similarity between different data samples, and instead these computers rely on complex signal processing techniques. Determining whether a data sample matches or is similar to other data samples is not a trivial task and poses several technical challenges for conventional computers. These technical challenges result in complex processes that consume processing power which reduces the speed and performance of the system.

In contrast to conventional systems, the user device 100 operates as a special purpose machine for implementing or emulating a correlithm object processing system. Implementing or emulating a correlithm object processing system improves the operation of the user device 100 by enabling the user device 100 to perform non-binary comparisons (i.e. match or no match) between different data samples. This enables the user device 100 to quantify a degree of similarity between different data samples. This increases the flexibility of the user device 100 to work with data samples having different data types and/or formats, and also increases the speed and performance of the user device 100 when performing operations using data samples. These improvements and other benefits to the user device 100 are described in more detail below and throughout the disclosure.

For example, the user device 100 employs the correlithm object processing system to allow the user device 100 to compare data samples even when the input data sample does not exactly match any known or previously stored input values. Implementing a correlithm object processing system fundamentally changes the user device 100 and the traditional data processing paradigm. Implementing the correlithm object processing system improves the operation of the user device 100 by enabling the user device 100 to perform non-binary comparisons of data samples. In other words, the user device 100 is able to determine how similar the data samples are to each other even when the data samples are not exact matches. In addition, the user device 100 is able to quantify how similar data samples are to one another. The ability to determine how similar data samples are to each others is unique and distinct from conventional computers that can only perform binary comparisons to identify exact matches.

The user device's 100 ability to perform non-binary comparisons of data samples also fundamentally changes traditional data searching paradigms. For example, conventional search engines rely on finding exact matches or exact partial matches of search tokens to identify related data samples. For instance, conventional text-based search engine are limited to finding related data samples that have text that exactly matches other data samples. These search engines only provide a binary result that identifies whether or not an exact match was found based on the search token. Implementing the correlithm object processing system improves the operation of the user device 100 by enabling the user device 100 to identify related data samples based on how similar the search token is to other data sample. These improvements result in increased flexibility and faster search time when using a correlithm object processing system. The ability to identify similarities between data samples expands the capabilities of a search engine to include data samples that may not have an exact match with a search token but are still related and similar in some aspects. The user device 100 is also able to quantify how similar data samples are to each other based on characteristics besides exact matches to the search token. Implementing the correlithm object processing system involves operating the user device 100 in an unconventional manner to achieve these technological improvements as well as other benefits described below for the user device 100.

Computing devices typically rely on the ability to compare data sets (e.g. data samples) to one another for processing. For example, in security or authentication applications a computing device is configured to compare an input of an unknown person to a data set of known people (or biometric information associated with these people). The problems associated with comparing data sets and identifying matches based on the comparison are problems necessarily rooted in computer technologies. As described above, conventional systems are limited to a binary comparison that can only determine whether an exact match is found. As an example, an input data sample that is an image of a person may have different lighting conditions than previously stored images. In this example, different lighting conditions can make images of the same person appear different from each other. Conventional computers are unable to distinguish between two images of the same person with different lighting conditions and two images of two different people without complicated signal processing. In both of these cases, conventional computers can only determine that the images are different. This is because conventional computers rely on manipulating ordinal numbers for processing.

In contrast, the user device 100 uses an unconventional configuration that uses correlithm objects to represent data samples. Using correlithm objects to represent data samples fundamentally changes the operation of the user device 100 and how the device views data samples. By implementing a correlithm object processing system, the user device 100 can determine the distance between the data samples and other known data samples to determine whether the input data sample matches or is similar to the other known data samples, as explained in detail below. Unlike the conventional computers described in the previous example, the user device 100 is able to distinguish between two images of the same person with different lighting conditions and two images of two different people by using correlithm objects 104. Correlithm objects allow the user device 100 to determine whether there are any similarities between data samples, such as between two images that are different from each other in some respects but similar in other respects. For example, the user device 100 is able to determine that despite different lighting conditions, the same person is present in both images.

In addition, the user device 100 is able to determine a degree of similarity that quantifies how similar different data samples are to one another. Implementing a correlithm object processing system in the user device 100 improves the operation of the user device 100 when comparing data sets and identifying matches by allowing the user device 100 to perform non-binary comparisons between data sets and to quantify the similarity between different data samples. In addition, using a correlithm object processing system results in increased flexibility and faster search times when comparing data samples or data sets. Thus, implementing a correlithm object processing system in the user device 100 provides a technical solution to a problem necessarily rooted in computer technologies.

The ability to implement a correlithm object processing system provides a technical advantage by allowing the system to identify and compare data samples regardless of whether an exact match has been previous observed or stored. In other words, using the correlithm object processing system the user device 100 is able to identify similar data samples to an input data sample in the absence of an exact match. This functionality is unique and distinct from conventional computers that can only identify data samples with exact matches.

Examples of data samples include, but are not limited to, images, files, text, audio signals, biometric signals, electric signals, or any other suitable type of data. A correlithm object 104 is a point in the n-dimensional space 102, sometimes called an "n-space." The value of 'n' represents the number of dimensions of the space. For example, an n-dimensional space 102 may be a 3-dimensional space, a 50-dimensional space, a 100-dimensional space, or any other suitable dimension space. The number of dimensions depends on its ability to support certain statistical tests, such as the distances between pairs of randomly chosen points in the space approximating a normal distribution. In some embodiments, increasing the number of dimensions in the n-dimensional space 102 modifies the statistical properties of the system to provide improved results. Increasing the number of dimensions increases the probability that a correlithm object 104 is similar to other adjacent correlithm objects 104. In other words, increasing the number of dimensions increases the correlation between how close a pair of correlithm objects 104 are to each other and how similar the correlithm objects 104 are to each other.

Correlithm object processing systems use new types of data structures called correlithm objects 104 that improve the way a device operates, for example, by enabling the device to perform non-binary data set comparisons and to quantify the similarity between different data samples. Correlithm objects 104 are data structures designed to improve the way a device stores, retrieves, and compares data samples in memory. Unlike conventional data structures, correlithm objects 104 are data structures where objects can be expressed in a high-dimensional space such that distance 106 between points in the space represent the similarity between different objects or data samples. In other words, the distance 106 between a pair of correlithm objects 104 in the n-dimensional space 102 indicates how similar the correlithm objects 104 are from each other and the data samples they represent. Correlithm objects 104 that are close to each other are more similar to each other than correlithm objects 104 that are further apart from each other. For example, in a facial recognition application, correlithm objects 104 used to represent images of different types of glasses may be relatively close to each other compared to correlithm objects 104 used to represent images of other features such as facial hair. An exact match between two data samples occurs when their corresponding correlithm objects 104 are the same or have no distance between them. When two data samples are not exact matches but are similar, the distance between their correlithm objects 104 can be used to indicate their similarities. In other words, the distance 106 between correlithm objects 104 can be used to identify both data samples that exactly match each other as well as data samples that do not match but are similar. This feature is unique to a correlithm processing system and is unlike conventional computers that are unable to detect when data samples are different but similar in some aspects.

Correlithm objects 104 also provide a data structure that is independent of the data type and format of the data samples they represent. Correlithm objects 104 allow data samples to be directly compared regardless of their original data type and/or format. In some instances, comparing data samples as correlithm objects 104 is computationally more efficient and faster than comparing data samples in their original format. For example, comparing images using conventional data structures involves significant amounts of image processing which is time consuming and consumes processing resources. Thus, using correlithm objects 104 to represent data samples provides increased flexibility and improved performance compared to using other conventional data structures.

In one embodiment, correlithm objects 104 may be represented using categorical binary strings. The number of bits used to represent the correlithm object 104 corresponds with the number of dimensions of the n-dimensional space 102 where the correlithm object 102 is located. For example, each correlithm object 104 may be uniquely identified using a 64-bit string in a 64-dimensional space 102. As another example, each correlithm object 104 may be uniquely identified using a 10-bit string in a 10-dimensional space 102. In other examples, correlithm objects 104 can be identified using any other suitable number of bits in a string that corresponds with the number of dimensions in the n-dimensional space 102.

In this configuration, the distance 106 between two correlithm objects 104 can be determined based on the differences between the bits of the two correlithm objects 104. In other words, the distance 106 between two correlithm objects can be determined based on how many individual bits differ between the correlithm objects 104. The distance 106 between two correlithm objects 104 can be computed using Hamming distance or any other suitable technique.

As an example using a 10-dimensional space 102, a first correlithm object 104 is represented by a first 10-bit string (1001011011) and a second correlithm object 104 is represented by a second 10-bit string (1000011011). The Hamming distance corresponds to the number of bits that differ between the first correlithm object 104 and the second correlithm object 104. In other words, the Hamming distance between the first correlithm object 104 and the second correlithm object 104 can be computed as follows:

$$\begin{array}{r}1001011011\\ 1000011011\\ \hline 0001000000\end{array}$$

In this example, the Hamming distance is equal to one because only one bit differs between the first correlithm object 104 and the second correlithm object. As another example, a third correlithm object 104 is represented by a third 10-bit string (0110100100). In this example, the Hamming distance between the first correlithm object 104 and the third correlithm object 104 can be computed as follows:

$$\begin{array}{r}1001011011\\ 0110100100\\ \hline 1111111111\end{array}$$

The Hamming distance is equal to ten because all of the bits are different between the first correlithm object 104 and the third correlithm object 104. In the previous example, a Hamming distance equal to one indicates that the first correlithm object 104 and the second correlithm object 104 are close to each other in the n-dimensional space 102, which means they are similar to each other. In the second example, a Hamming distance equal to ten indicates that the first correlithm object 104 and the third correlithm object 104 are further from each other in the n-dimensional space 102 and are less similar to each other than the first correlithm object 104 and the second correlithm object 104. In other words, the similarity between a pair of correlithm objects can be readily determined based on the distance in n-dimensional space between the pair correlithm objects.

As another example, the distance between a pair of correlithm objects 104 can be determined by performing an XOR operation between the pair of correlithm objects 104 and counting the number of logical high values in the binary string. The number of logical high values indicates the number of bits that are different between the pair of correlithm objects 104 which also corresponds with the Hamming distance between the pair of correlithm objects 104.

In another embodiment, the distance 106 between two correlithm objects 104 can be determined using a Minkowski distance such as the Euclidean or "straight-line" distance between the correlithm objects 104. For example, the distance 106 between a pair of correlithm objects 104 may be determined by calculating the square root of the sum of squares of the coordinate difference in each dimension.

The user device 100 is configured to implement or emulate a correlithm object processing system that comprises one or more sensors 302, nodes 304, and/or actors 306 in order to convert data samples between real world values or representations and to correlithm objects 104 in a correlithm object domain. Sensors 302 are generally configured to convert real world data samples to the correlithm object domain. Nodes 304 are generally configured to process or perform various operations on correlithm objects in the correlithm object domain. Actors 306 are generally configured to convert correlithm objects 104 into real world values or representations. Additional information about sensors 302, nodes 304, and actors 306 is described in FIG. 3.

Performing operations using correlithm objects 104 in a correlithm object domain allows the user device 100 to identify relationships between data samples that cannot be identified using conventional data processing systems. For example, in the correlithm object domain, the user device 100 is able to identify not only data samples that exactly match an input data sample, but also other data samples that have similar characteristics or features as the input data samples. Conventional computers are unable to identify these types of relationships readily. Using correlithm objects 104 improves the operation of the user device 100 by enabling the user device 100 to efficiently process data samples and identify relationships between data samples without relying on signal processing techniques that require a significant amount of processing resources. These benefits allow the user device 100 to operate more efficiently than conventional computers by reducing the amount of processing power and resources that are needed to perform various operations.

Figure 2:
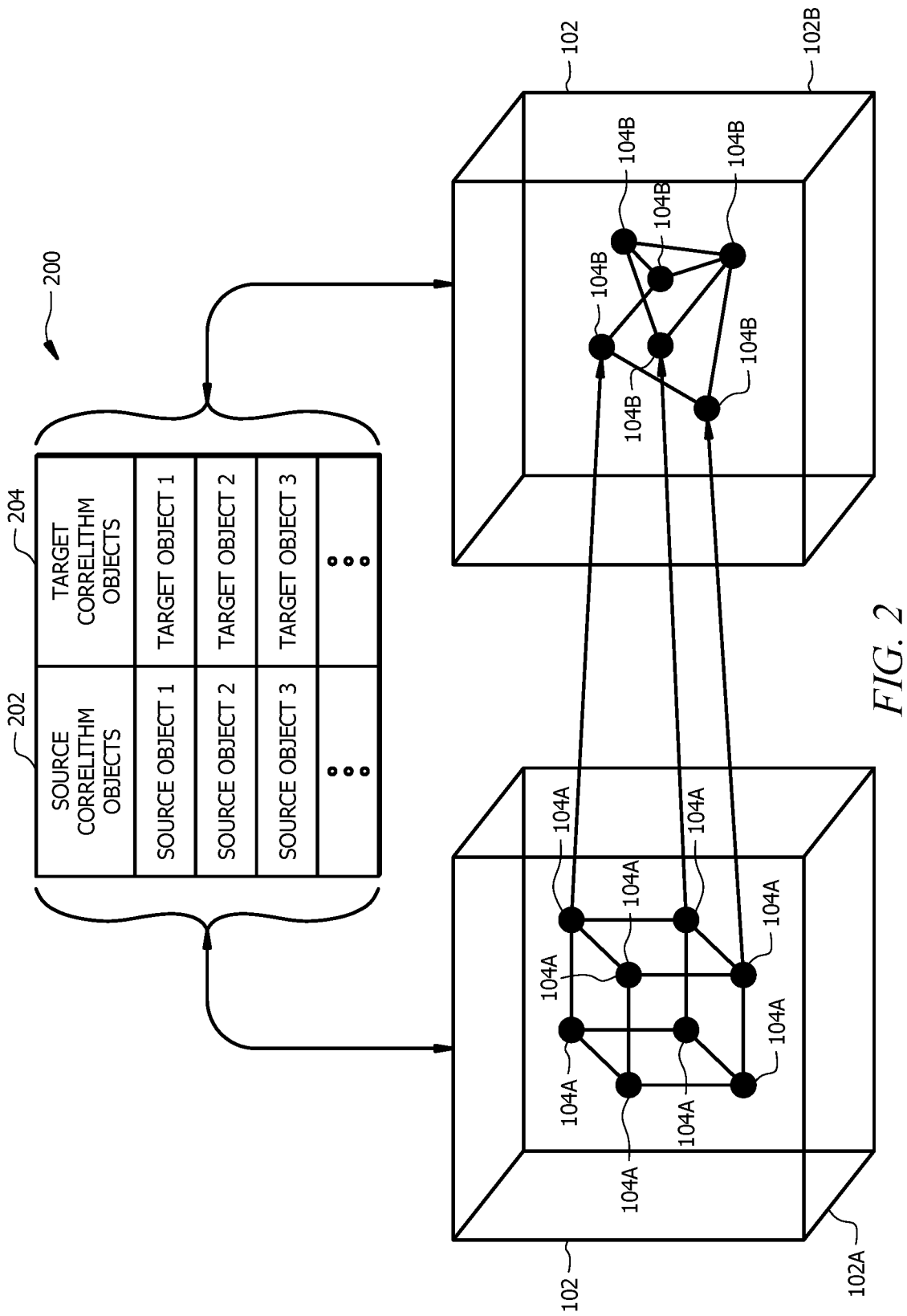
FIG. 2 is a perspective view of an embodiment of a mapping between correlithm objects in different n-dimensional spaces.

FIG. 2 is a schematic view of an embodiment of a mapping between correlithm objects 104 in different n-dimensional spaces 102. When implementing a correlithm object processing system, the user device 100 performs operations within the correlithm object domain using correlithm objects 104 in different n-dimensional spaces 102. As an example, the user device 100 may convert different types of data samples having real world values into correlithm objects 104 in different n-dimensional spaces 102. For instance, the user device 100 may convert data samples of text into a first set of correlithm objects 104 in a first n-dimensional space 102 and data samples of audio samples as a second set of correlithm objects 104 in a second n-dimensional space 102. Conventional systems require data samples to be of the same type and/or format in order to perform any kind of operation on the data samples. In some instances, some types of data samples cannot be compared because there is no common format available. For example, conventional computers are unable to compare data samples of images and data samples of audio samples because there is no common format. In contrast, the user device 100 implementing a correlithm object processing system is able to compare and perform operations using correlithm objects 104 in the correlithm object domain regardless of the type or format of the original data samples.

In FIG. 2, a first set of correlithm objects 104A are defined within a first n-dimensional space 102A and a second set of correlithm objects 104B are defined within a second n-dimensional space 102B. The n-dimensional spaces may have the same number dimensions or a different number of dimensions. For example, the first n-dimensional space 102A and the second n-dimensional space 102B may both be three dimensional spaces. As another example, the first n-dimensional space 102A may be a three dimensional space and the second n-dimensional space 102B may be a nine dimensional space. Correlithm objects 104 in the first n-dimensional space 102A and second n-dimensional space 102B are mapped to each other. In other words, a correlithm object 104A in the first n-dimensional space 102A may reference or be linked with a particular correlithm object 104B in the second n-dimensional space 102B. The correlithm objects 104 may also be linked with and referenced with other correlithm objects 104 in other n-dimensional spaces 102.

In one embodiment, a data structure such as table 200 may be used to map or link correlithm objects 194 in different n-dimensional spaces 102. In some instances, table 200 is referred to as a node table. Table 200 is generally configured to identify a first plurality of correlithm objects 104 in a first n-dimensional space 102 and a second plurality of correlithm objects 104 in a second n-dimensional space 102. Each correlithm object 104 in the first n-dimensional space 102 is linked with a correlithm object 104 is the second n-dimensional space 102. For example, table 200 may be configured with a first column 202 that lists correlithm objects 104A as source correlithm objects and a second column 204 that lists corresponding correlithm objects 104B as target correlithm objects. In other examples, table 200 may be configured in any other suitable manner or may be implemented using any other suitable data structure. In some embodiments, one or more mapping functions may be used to convert between a correlithm object 104 in a first n-dimensional space and a correlithm object 104 is a second n-dimensional space.

Figure 3:
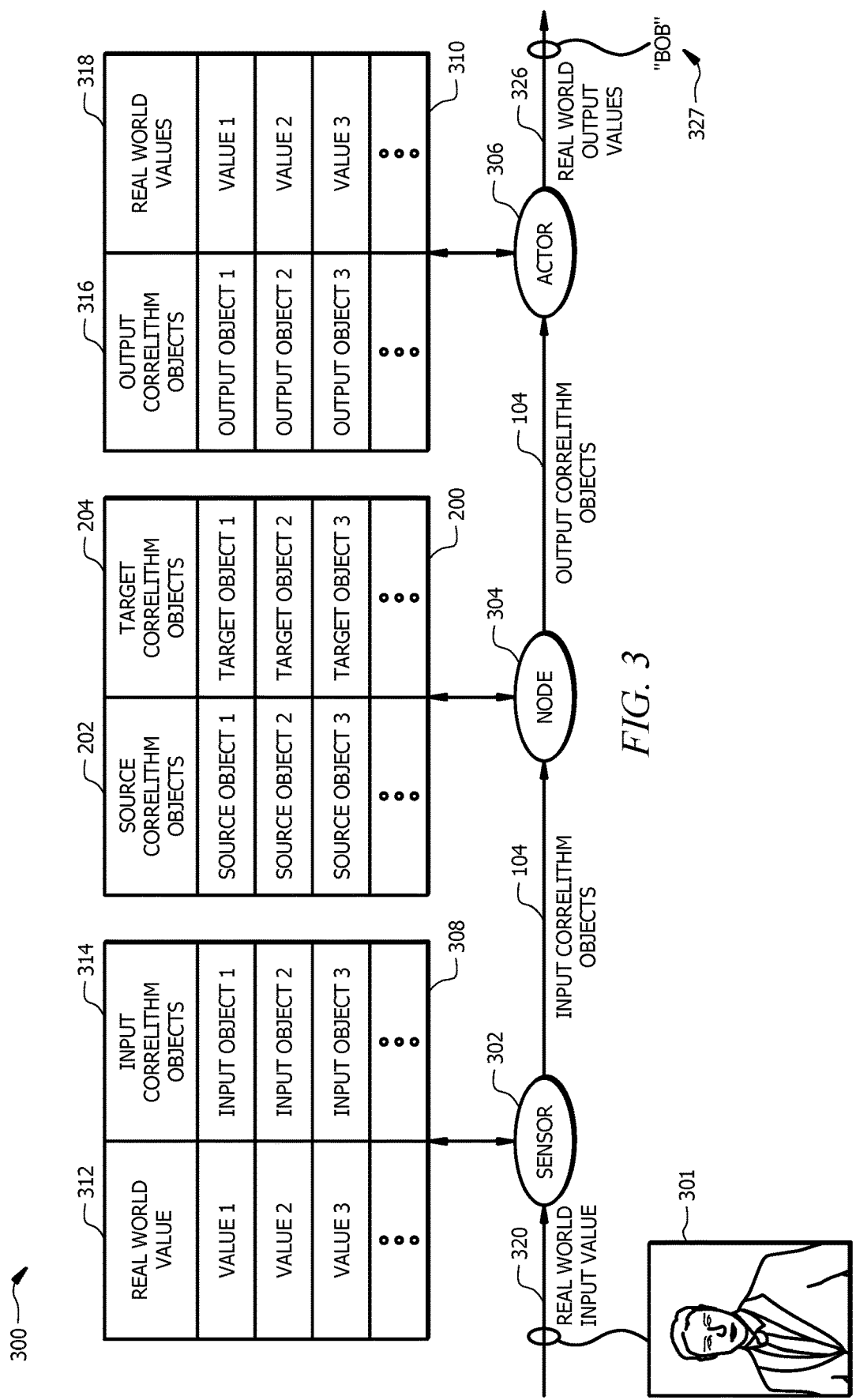
FIG. 3 is a schematic view of an embodiment of a correlithm object processing system.

FIG. 3 is a schematic view of an embodiment of a correlithm object processing system 300 that is implemented by a user device 100 to perform operations using correlithm objects 104. The system 300 generally comprises a sensor 302, a node 304, and an actor 306. The system 300 may be configured with any suitable number and/or configuration of sensors 302, nodes 304, and actors 306. An example of the system 300 in operation is described in FIG. 4. In one embodiment, a sensor 302, a node 304, and an actor 306 may all be implemented on the same device (e.g. user device 100). In other embodiments, a sensor 302, a node 304, and an actor 306 may each be implemented on different devices in signal communication with each other for example over a network. In other embodiments, different devices may be configured to implement any combination of sensors 302, nodes 304, and actors 306.

Sensors 302 serve as interfaces that allow a user device 100 to convert real world data samples into correlithm objects 104 that can be used in the correlithm object domain. Sensors 302 enable the user device 100 compare and perform operations using correlithm objects 104 regardless of the data type or format of the original data sample. Sensors 302 are configured to receive a real world value 320 representing a data sample as an input, to determine a correlithm object 104 based on the real world value 320, and to output the correlithm object 104. For example, the sensor 302 may receive an image 301 of a person and output a correlithm object 322 to the node 304 or actor 306. In one embodiment, sensors 302 are configured to use sensor tables 308 that link a plurality of real world values with a plurality of correlithm objects 104 in an n-dimensional space 102. Real world values are any type of signal, value, or representation of data samples. Examples of real world values include, but are not limited to, images, pixel values, text, audio signals, electrical signals, and biometric signals. As an example, a sensor table 308 may be configured with a first column 312 that lists real world value entries corresponding with different images and a second column 314 that lists corresponding correlithm objects 104 as input correlithm objects. In other examples, sensor tables 308 may be configured in any other suitable manner or may be implemented using any other suitable data structure. In some embodiments, one or more mapping functions may be used to translate between a real world value 320 and a correlithm object 104 is a n-dimensional space. Additional information for implementing or emulating a sensor 302 in hardware is described in FIG. 5.

Nodes 304 are configured to receive a correlithm object 104 (e.g. an input correlithm object 104), to determine another correlithm object 104 based on the received correlithm object 104, and to output the identified correlithm object 104 (e.g. an output correlithm object 104). In one embodiment, nodes 304 are configured to use node tables 200 that link a plurality of correlithm objects 104 from a first n-dimensional space 102 with a plurality of correlithm objects 104 in a second n-dimensional space 102. A node table 200 may be configured similar to the table 200 described in FIG. 2. Additional information for implementing or emulating a node 304 in hardware is described in FIG. 5.

Actors 306 serve as interfaces that allow a user device 100 to convert correlithm objects 104 in the correlithm object domain back to real world values or data samples. Actors 306 enable the user device 100 to convert from correlithm objects 104 into any suitable type of real world value. Actors 306 are configured to receive a correlithm object 104 (e.g. an output correlithm object 104), to determine a real world output value 326 based on the received correlithm object 104, and to output the real world output value 326. The real world output value 326 may be a different data type or representation of the original data sample. As an example, the real world input value 320 may be an image 301 of a person and the resulting real world output value 326 may be text 327 and/or an audio signal identifying the person. In one embodiment, actors 306 are configured to use actor tables 310 that link a plurality of correlithm objects 104 in an n-dimensional space 102 with a plurality of real world values. As an example, an actor table 310 may be configured with a first column 316 that lists correlithm objects 104 as output correlithm objects and a second column 318 that lists real world values. In other examples, actor tables 310 may be configured in any other suitable manner or may be implemented using any other suitable data structure. In some embodiments, one or more mapping functions may be employed to translate between a correlithm object 104 in an n-dimensional space and a real world output value 326. Additional information for implementing or emulating an actor 306 in hardware is described in FIG. 5.

A correlithm object processing system 300 uses a combination of a sensor table 308, a node table 200, and/or an actor table 310 to provide a specific set of rules that improve computer-related technologies by enabling devices to compare and to determine the degree of similarity between different data samples regardless of the data type and/or format of the data sample they represent. The ability to directly compare data samples having different data types and/or formatting is a new functionality that cannot be performed using conventional computing systems and data structures. Conventional systems require data samples to be of the same type and/or format in order to perform any kind of operation on the data samples. In some instances, some types of data samples are incompatible with each other and cannot be compared because there is no common format available. For example, conventional computers are unable to compare data samples of images with data samples of audio samples because there is no common format available. In contrast, a device implementing a correlithm object processing system uses a combination of a sensor table 308, a node table 200, and/or an actor table 310 to compare and perform operations using correlithm objects 104 in the correlithm object domain regardless of the type or format of the original data samples. The correlithm object processing system 300 uses a combination of a sensor table 308, a node table 200, and/or an actor table 310 as a specific set of rules that provides a particular solution to dealing with different types of data samples and allows devices to perform operations on different types of data samples using correlithm objects 104 in the correlithm object domain. In some instances, comparing data samples as correlithm objects 104 is computationally more efficient and faster than comparing data samples in their original format. Thus, using correlithm objects 104 to represent data samples provides increased flexibility and improved performance compared to using other conventional data structures. The specific set of rules used by the correlithm object processing system 300 go beyond simply using routine and conventional activities in order to achieve this new functionality and performance improvements.

In addition, correlithm object processing system 300 uses a combination of a sensor table 308, a node table 200, and/or an actor table 310 to provide a particular manner for transforming data samples between ordinal number representations and correlithm objects 104 in a correlithm object domain. For example, the correlithm object processing system 300 may be configured to transform a representation of a data sample into a correlithm object 104, to perform various operations using the correlithm object 104 in the correlithm object domain, and to transform a resulting correlithm object 104 into another representation of a data sample. Transforming data samples between ordinal number representations and correlithm objects 104 involves fundamentally changing the data type of data samples between an ordinal number system and a categorical number system to achieve the previously described benefits of the correlithm object processing system 300.

Figure 4:
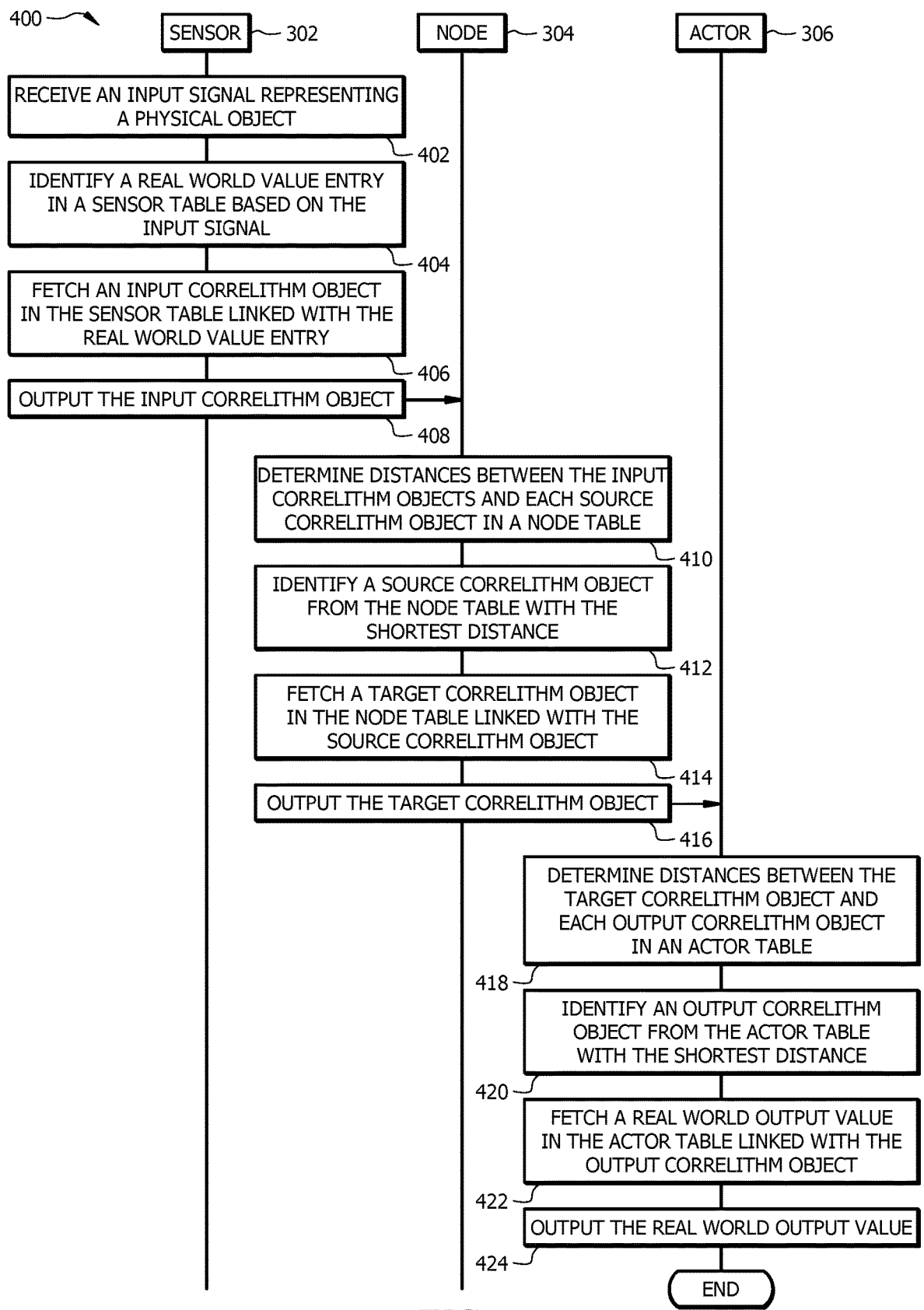
FIG. 4 is a protocol diagram of an embodiment of a correlithm object process flow.

FIG. 4 is a protocol diagram of an embodiment of a correlithm object process flow 400. A user device 100 implements process flow 400 to emulate a correlithm object processing system 300 to perform operations using correlithm object 104 such as facial recognition. The user device 100 implements process flow 400 to compare different data samples (e.g. images, voice signals, or text) are to each other and to identify other objects based on the comparison. Process flow 400 provides instructions that allows user devices 100 to achieve the improved technical benefits of a correlithm object processing system 300.

Conventional systems are configured to use ordinal numbers for identifying different data samples. Ordinal based number systems only provide information about the sequence order of numbers based on their numeric values, and do not provide any information about any other types of relationships for the data samples being represented by the numeric values such as similarity. In contrast, a user device 100 can implement or emulate the correlithm object processing system 300 which provides an unconventional solution that uses categorical numbers and correlithm objects 104 to represent data samples. For example, the system 300 may be configured to use binary integers as categorical numbers to generate correlithm objects 104 which enables the user device 100 to perform operations directly based on similarities between different data samples. Categorical numbers provide information about how similar different data sample are from each other. Correlithm objects 104 generated using categorical numbers can be used directly by the system 300 for determining how similar different data samples are from each other without relying on exact matches, having a common data type or format, or conventional signal processing techniques.

A non-limiting example is provided to illustrate how the user device 100 implements process flow 400 to emulate a correlithm object processing system 300 to perform facial recognition on an image to determine the identity of the person in the image. In other examples, the user device 100 may implement process flow 400 to emulate a correlithm object processing system 300 to perform voice recognition, text recognition, or any other operation that compares different objects.

At step 402, a sensor 302 receives an input signal representing a data sample. For example, the sensor 302 receives an image of person's face as a real world input value 320. The input signal may be in any suitable data type or format. In one embodiment, the sensor 302 may obtain the input signal in real-time from a peripheral device (e.g. a camera). In another embodiment, the sensor 302 may obtain the input signal from a memory or database.

At step 404, the sensor 302 identifies a real world value entry in a sensor table 308 based on the input signal. In one embodiment, the system 300 identifies a real world value entry in the sensor table 308 that matches the input signal. For example, the real world value entries may comprise previously stored images. The sensor 302 may compare the received image to the previously stored images to identify a real world value entry that matches the received image. In one embodiment, when the sensor 302 does not find an exact match, the sensor 302 finds a real world value entry that closest matches the received image.

At step 406, the sensor 302 identifies and fetches an input correlithm object 104 in the sensor table 308 linked with the real world value entry. At step 408, the sensor 302 sends the identified input correlithm object 104 to the node 304. In one embodiment, the identified input correlithm object 104 is represented in the sensor table 308 using a categorical binary integer string. The sensor 302 sends the binary string representing to the identified input correlithm object 104 to the node 304.

At step 410, the node 304 receives the input correlithm object 104 and determines distances 106 between the input correlithm object 104 and each source correlithm object 104 in a node table 200. In one embodiment, the distance 106 between two correlithm objects 104 can be determined based on the differences between the bits of the two correlithm objects 104. In other words, the distance 106 between two correlithm objects can be determined based on how many individual bits differ between a pair of correlithm objects 104. The distance 106 between two correlithm objects 104 can be computed using Hamming distance or any other suitable technique. In another embodiment, the distance 106 between two correlithm objects 104 can be determined using a Minkowski distance such as the Euclidean or "straight-line" distance between the correlithm objects 104. For example, the distance 106 between a pair of correlithm objects 104 may be determined by calculating the square root of the sum of squares of the coordinate difference in each dimension.

At step 412, the node 304 identifies a source correlithm object 104 from the node table 200 with the shortest distance 106. A source correlithm object 104 with the shortest distance from the input correlithm object 104 is a correlithm object 104 either matches or most closely matches the received input correlithm object 104.

At step 414, the node 304 identifies and fetches a target correlithm object 104 in the node table 200 linked with the source correlithm object 104. At step 416, the node 304 outputs the identified target correlithm object 104 to the actor 306. In this example, the identified target correlithm object 104 is represented in the node table 200 using a categorical binary integer string. The node 304 sends the binary string representing to the identified target correlithm object 104 to the actor 306.

At step 418, the actor 306 receives the target correlithm object 104 and determines distances between the target correlithm object 104 and each output correlithm object 104 in an actor table 310. The actor 306 may compute the distances between the target correlithm object 104 and each output correlithm object 104 in an actor table 310 using a process similar to the process described in step 410.

At step 420, the actor 306 identifies an output correlithm object 104 from the actor table 310 with the shortest distance 106. An output correlithm object 104 with the shortest distance from the target correlithm object 104 is a correlithm object 104 either matches or most closely matches the received target correlithm object 104.

At step 422, the actor 306 identifies and fetches a real world output value in the actor table 310 linked with the output correlithm object 104. The real world output value may be any suitable type of data sample that corresponds with the original input signal. For example, the real world output value may be text that indicates the name of the person in the image or some other identifier associated with the person in the image. As another example, the real world output value may be an audio signal or sample of the name of the person in the image. In other examples, the real world output value may be any other suitable real world signal or value that corresponds with the original input signal. The real world output value may be in any suitable data type or format.

At step 424, the actor 306 outputs the identified real world output value. In one embodiment, the actor 306 may output the real world output value in real-time to a peripheral device (e.g. a display or a speaker). In one embodiment, the actor 306 may output the real world output value to a memory or database. In one embodiment, the real world output value is sent to another sensor 302. For example, the real world output value may be sent to another sensor 302 as an input for another process.

Figure 5:
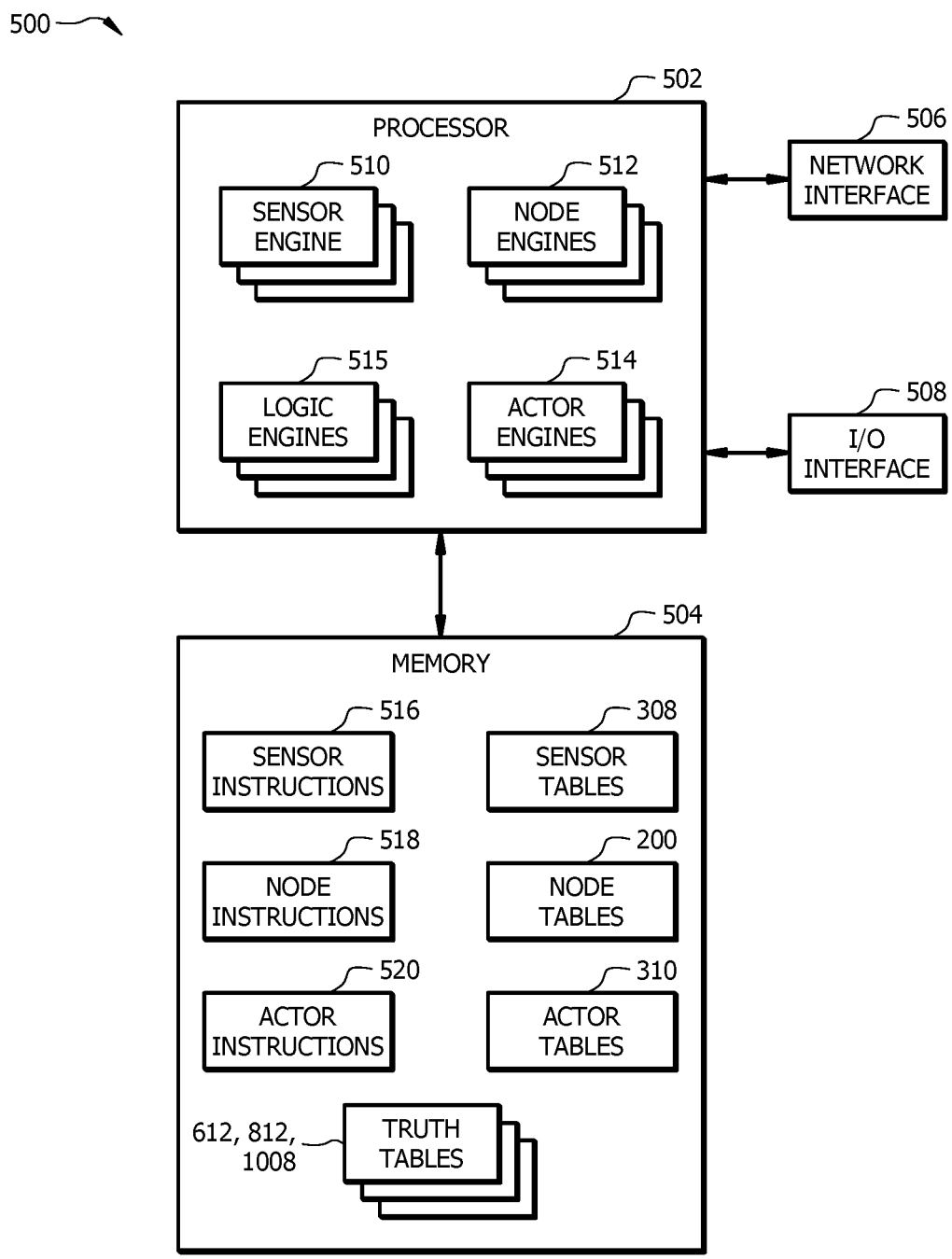
FIG. 5 is a schematic diagram of an embodiment a computer architecture for emulating a correlithm object processing system.

FIG. 5 is a schematic diagram of an embodiment a computer architecture 500 for emulating a correlithm object processing system 300 in a user device 100. The computer architecture 500 comprises a processor 502, a memory 504, a network interface 506, and an input-output (I/O) interface 508. The computer architecture 500 may be configured as shown or in any other suitable configuration.

The processor 502 comprises one or more processors operably coupled to the memory 504. The processor 502 is any electronic circuitry including, but not limited to, state machines, one or more central processing unit (CPU) chips, logic units, cores (e.g. a multi-core processor), field-programmable gate array (FPGAs), application specific integrated circuits (ASICs), graphics processing units (GPUs), or digital signal processors (DSPs). The processor 502 may be a programmable logic device, a microcontroller, a microprocessor, or any suitable combination of the preceding. The processor 502 is communicatively coupled to and in signal communication with the memory 204. The one or more processors are configured to process data and may be implemented in hardware or software. For example, the processor 502 may be 8-bit, 16-bit, 32-bit, 64-bit or of any other suitable architecture. The processor 502 may include an arithmetic logic unit (ALU) for performing arithmetic and logic operations, processor registers that supply operands to the ALU and store the results of ALU operations, and a control unit that fetches instructions from memory and executes them by directing the coordinated operations of the ALU, registers and other components.

The one or more processors are configured to implement various instructions. For example, the one or more processors are configured to execute instructions to implement sensor engines 510, node engines 512, actor engines 514 and logic engines 515 that implement logic gates 600, 800, and 1000. In an embodiment, the sensor engines 510, the node engines 512, and the actor engines 514 are implemented using logic units, FPGAs, ASICs, DSPs, or any other suitable hardware. The sensor engines 510, the node engines 512, and the actor engines 514 are each configured to implement a specific set of rules or process that provides an improved technological result.

In one embodiment, the sensor engine 510 is configured to receive a real world value 320 as an input, to determine a correlithm object 104 based on the real world value 320, and to output the correlithm object 104. Examples of the sensor engine 510 in operation are described in FIG. 4.

In one embodiment, the node engine 512 is configured to receive a correlithm object 104 (e.g. an input correlithm object 104), to determine another correlithm object 104 based on the received correlithm object 104, and to output the identified correlithm object 104 (e.g. an output correlithm object 104). The node engine 512 is also configured to compute distances between pairs of correlithm objects 104. Examples of the node engine 512 in operation are described in FIG. 4.

In one embodiment, the actor engine 514 is configured to receive a correlithm object 104 (e.g. an output correlithm object 104), to determine a real world output value 326 based on the received correlithm object 104, and to output the real world output value 326. Examples of the actor engine 514 in operation are described in FIG. 4.

The memory 504 comprises one or more non-transitory disks, tape drives, or solid-state drives, and may be used as an over-flow data storage device, to store programs when such programs are selected for execution, and to store instructions and data that are read during program execution. The memory 504 may be volatile or non-volatile and may comprise read-only memory (ROM), random-access memory (RAM), ternary content-addressable memory (TCAM), dynamic random-access memory (DRAM), and static random-access memory (SRAM). The memory 504 is operable to store sensor instructions 516, node instructions 518, actor instructions 520, sensor tables 308, node tables 200, actor tables 310, truth tables 612, 812, and 1008, and/or any other data or instructions. The sensor instructions 516, the node instructions 518, and the actor instructions 520 comprise any suitable set of instructions, logic, rules, or code operable to execute the sensor engine 510, node engine 512, and the actor engine 514, respectively.

The sensor tables 308, the node tables 200, and the actor tables 310 may be configured similar to the sensor tables 308, the node tables 200, and the actor tables 310 described in FIG. 3, respectively.

The network interface 506 is configured to enable wired and/or wireless communications. The network interface 506 is configured to communicate data with any other device or system. For example, the network interface 506 may be configured for communication with a modem, a switch, a router, a bridge, a server, or a client. The processor 502 is configured to send and receive data using the network interface 506.

The I/O interface 508 may comprise ports, transmitters, receivers, transceivers, or any other devices for transmitting and/or receiving data with peripheral devices as would be appreciated by one of ordinary skill in the art upon viewing this disclosure. For example, the I/O interface 508 may be configured to communicate data between the processor 502 and peripheral hardware such as a graphical user interface, a display, a mouse, a keyboard, a key pad, and a touch sensor (e.g. a touch screen).

Figure 6:
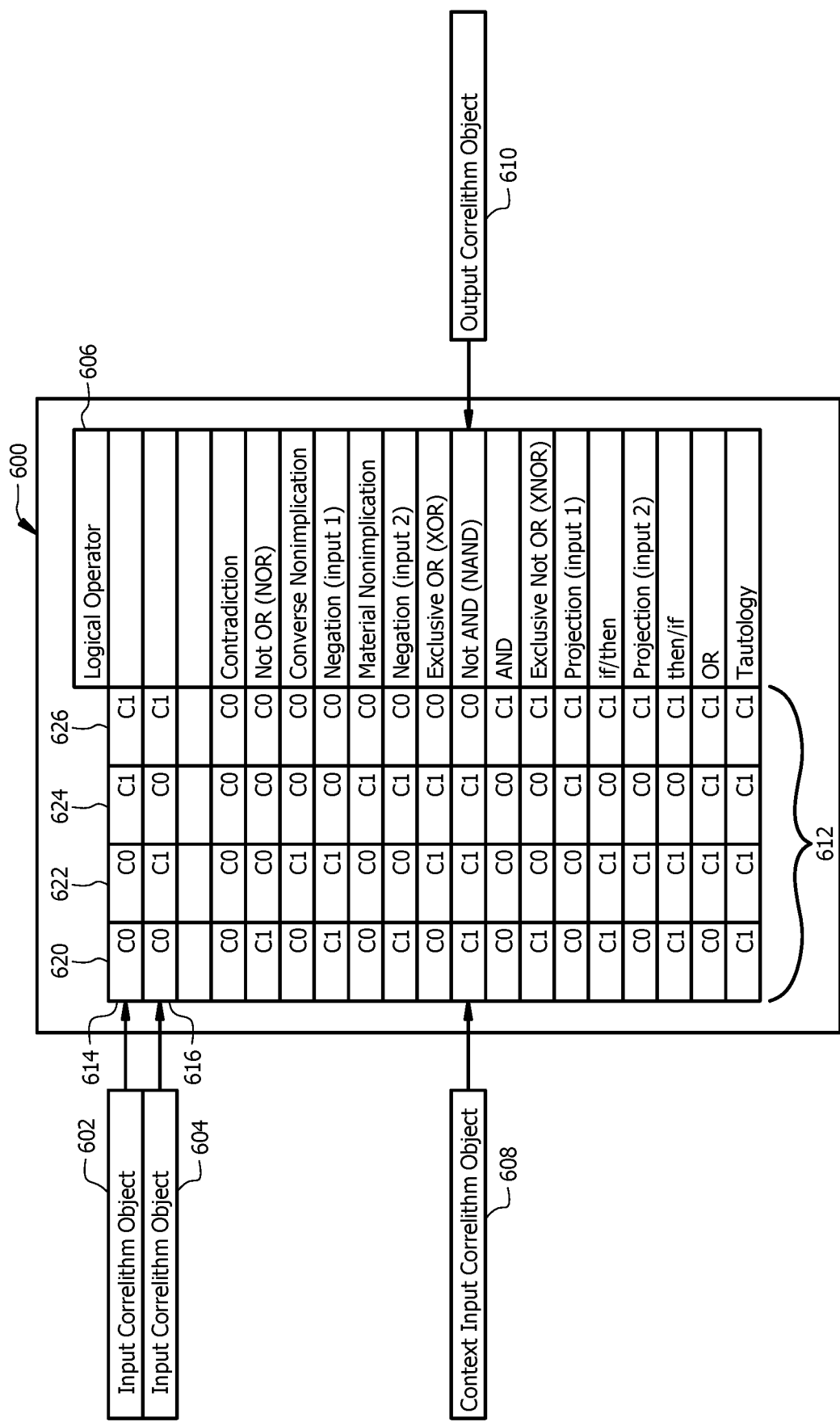
FIG. 6 illustrates one embodiment of a correlithm object binary logic function gate.

FIG. 6 illustrates one embodiment of a binary correlithm object logic function gate 600 that receives a first input correlithm object 602 and a second input correlithm object 604, implements a particular logical operator 606 according to a context input correlithm object 608 (in one embodiment), and outputs an output correlithm object 610. Binary correlithm object logic function gate 600 implements up to sixteen different logical operators 606 upon binary values represented by inputs correlithm objects 602 and 604. The logical operators 606 are represented by correlithm objects in a truth table 612, an example of which is illustrated in FIG. 6. Depending on the binary values that are input into gate 600 and the portion of the truth table 612 associated with the logical operator 606 that is implemented, gate 600 outputs an output correlithm object 610 representing a logical "0" or "1".

In one embodiment, the system will assign the same correlithm object for input 602 to represent a logical "0" as the correlithm object to represent a logical "0" in row 614 of the truth table 812. Further, the system will assign the same correlithm object for input 602 to represent a logical "1" as the correlithm object to represent a logical "1" in row 614 of the truth table 812. Similarly, the system will assign the same correlithm object for input 604 to represent a logical "0" as the correlithm object to represent a logical "0" in row 616 of the truth table 812. Further, the system will assign the same correlithm object for input 604 to represent a logical "1" as the correlithm object to represent a logical "1" in row 616 of the truth table 812.

The operation of logic function gate 600 is described below in conjunction with a particular example. In this example, assume that binary correlithm object logic function gate 600 implements only the logical "Not AND (NAND)" function or, alternatively in one embodiment, assume that binary correlithm object logic function gate 600 implements a number of logical operators 606 and that context input correlithm object 608 represents a value that selects the "Not AND (NAND)" function. In particular, each of the logical operators 606 are represented by a different, corresponding correlithm object.

The context input 608 is also represented by a correlithm object that is set to match the correlithm object of the logical operator 606 to be applied in a particular operation of logic function gate 600. For example, if the NAND function is to be applied by logic function gate 600, then the context input 608 is represented by a correlithm object that is set to the same n-bit (e.g., 64-bit) word of binary values as the correlithm object that represents the NAND function logical operator 606. When the correlithm object of the context input 608 is received, the logic function gate 600 determines the distance in n-dimensional space between the correlithm object of the context input 608 and each of the correlithm objects representing the logical operators 606. The logic function gate 600 selects for application whichever correlithm object representing a logical operator 606 is closest in n-dimensional space to the correlithm object of the context input 608. For example, in one embodiment, the logic function gate 600 determines the Hamming distance between the correlithm object of the context input 608 and each of the correlithm objects representing the logical operators 606, and selects the logical operator 606 based on which one has the smallest Hamming distance between its correlithm object and the correlithm object of the context input 608. Thus, if the correlithm object of the context input 608 is the closest in n-dimensional space to the correlithm object representing the NAND gate (e.g., has the smallest Hamming distance), then the portion of the truth table 612 that corresponds to the NAND function (e.g., ordered logical values c1, c1, c1, c0) is used by the logic function gate 600 in determining (at least in part) the output 610.

Referring back to the example, further assume that first input correlithm object 602 is a 64-bit correlithm object that represents a logical "0". For example, input correlithm object 602 may comprise a unique 64-bit word of "1's" and "0's" that is assigned to represent a logical "0". Further assume that second input correlithm object 604 is a 64-bit correlithm object that represents a logical "0". For example, input correlithm object 604 may comprise a different unique 64-bit word of "1's" and "0's" that is also assigned to represent a logical "0".

Binary logic function gate 600 determines the Hamming distance (or otherwise determines the distance in n-dimensional space) between input correlithm object 602 and the correlithm objects in row 614 of the truth table 612. Even if noise modifies some of the bits of the n-bit input correlithm object 602 and/or some of the bits of the n-bit correlithm objects representing the logical "0" and "1" values in row 614 of the truth table 612, the Hamming distance between the input correlithm object 602 representing a logical "0" and the correlithm object representing logical "0's" in row 614 (shown in the cells where row 614 intersects columns 620 and 622 of the truth table 612) will be smaller than the Hamming distance between the input correlithm object 602 representing a logical "0" and the correlithm object representing logical "1's" in row 614 (shown in the cells where row 614 intersects columns 624 and 626 of the truth table 612). The smaller Hamming distance calculation means that the input correlithm object 602 is closer in n-dimensional space to the correlithm object representing logical "0's" in row 614 than to the correlithm object representing logical "1's" in row 614. Thus, columns 620 and 622 are selected as matches for input correlithm object 602 based upon these Hamming distance calculations.

Logic function gate 600 also determines the Hamming distance (or otherwise determines the distance in n-dimensional space) between input correlithm object 604 and the correlithm objects in row 616 of the truth table 612. Even if noise modifies some of the bits of the n-bit input correlithm object 604 and some of the bits of the n-bit correlithm objects representing the logical "0" and "1" values in row 616, the Hamming distance between the correlithm object input 604 representing a logical "0" and the correlithm object representing logical "0's" in row 616 (shown in the cells where row 616 intersects columns 620 and 624 of the truth table 612) will be smaller than the Hamming distance between the input correlithm object 604 representing a logical "0" and the correlithm object representing logical "1's" in row 616 (shown in the cells where row 616 intersects columns 622 and 626 of the truth table 612). The smaller Hamming distance calculation means that the input correlithm object 604 is closer in n-dimensional space to the correlithm object representing logical "0's" in row 616 than to the correlithm object representing logical "1's" in row 616. Thus, columns 620 and 624 are selected as matches for correlithm object input 604 based upon these Hamming distance calculations.

Because the values in columns 620 and 622 were selected as matches for input correlithm object 602 and the values in columns 620 and 624 were selected as matches for input correlithm object 604, the only column that was selected as a match for both input correlithm objects 602 and 604 is column 620. Column 620 includes a logical "0" in row 614 which maps to the logical "0" represented by input 602, and column 620 further includes a logical "0" in row 616 which maps to the logical "0" represented by input 604. According to this set of inputs 602 and 604 and upon implementing the NAND function to the values in column 620, the resulting binary value is logical "1." Output correlithm object 610 may comprise a unique n-bit (e.g., 64-bit) word of 1's and 0's that is assigned to represent this resulting logical "1." In this way, the logic function gate 600 can implement the logical operators 606 associated with truth table 612 using correlithm objects rather than traditional voltage values to represent logical "0's" and "1's." Although the above example describes a NAND function, one of skill in the art will recognize that any of the logical operators 606 illustrated in FIG. 6 can be implemented either by building a logic function gate 600 dedicated to that logical operator 606, or by using a context input correlithm object 608 to identify a particular logical operator 606 in a multi-faceted logic function gate 600.

Implementing one or more logical operators 606 using correlithm objects, as described above, improves the operation of any electrical or computer system that uses such a logic gate 600. In particular, whereas a zero voltage that may represent a logical "0" in a conventional logic gate for a traditional computer system may be altered by a significant noise event (e.g., voltage surge caused by EMP) such that the logical value misrepresents the logical "0" as a logical "1" (or vice versa), the n-bit word of 1's and 0's that forms the input correlithm objects 602 and 604 would remain largely unaffected by noise. In particular, perhaps a few of the bits of the n-bit input correlithm objects 602 or 604 would be affected by the noise. Or, perhaps a few of the bits of the n-bit correlithm object values in the truth table 612 would be affected by the noise. However, the remaining bits of the n-bit input correlithm objects 602 or 604 (or correlithm objects representing values in the truth table 612) would remain close enough to the core of the original input correlithm object 602 or 604 (or correlithm objects representing values in the truth table 612) to accurately represent the original logical value. Thus, upon calculating the Hamming distance between the input correlithm object 602 (or 604) with the correlithm objects representing logical "0's" or "1's" in row 614 (or row 616), the system would associate the input correlithm object 602 (or 604) with the correct values in the truth table 612 with a greater degree of likelihood than in conventional computer systems that experience a significant noise event. Similarly, a significant noise event would not significantly affect the output correlithm object 610 either. In particular, perhaps a few of the bits of the n-bit output correlithm object 610 would be affected by the noise. However, the remaining bits of the n-bit output correlithm object 610 would remain close enough to the core of the original output correlithm object 610 to accurately represent the original logical value of "1." In this way, the implementation of a correlithm object logic function gate 600 improves the operation of the underlying electronic circuit or computer in comparison to conventional approaches of implementing logic gates.

In one embodiment, a different n-bit correlithm object is used to represent a logical "0" or logical "1" in input 602 than is used for input 604. Similarly, a different n-bit correlithm object is used to represent a logical "0" or logical "1" in output 610 than is used in either inputs 602 or 604. However, the same correlithm object is used to represent the logical "0's" in columns 620 and 622 of row 614; and the same correlithm object is used to represent the logical "1's" in columns 624 and 626 of row 614. Similarly, the same correlithm object is used to represent the logical "0's" in columns 620 and 624 of row 616; and the same correlithm object is used to represent the logical "1's" in columns 622 and 626 of row 616.

Figure 7:
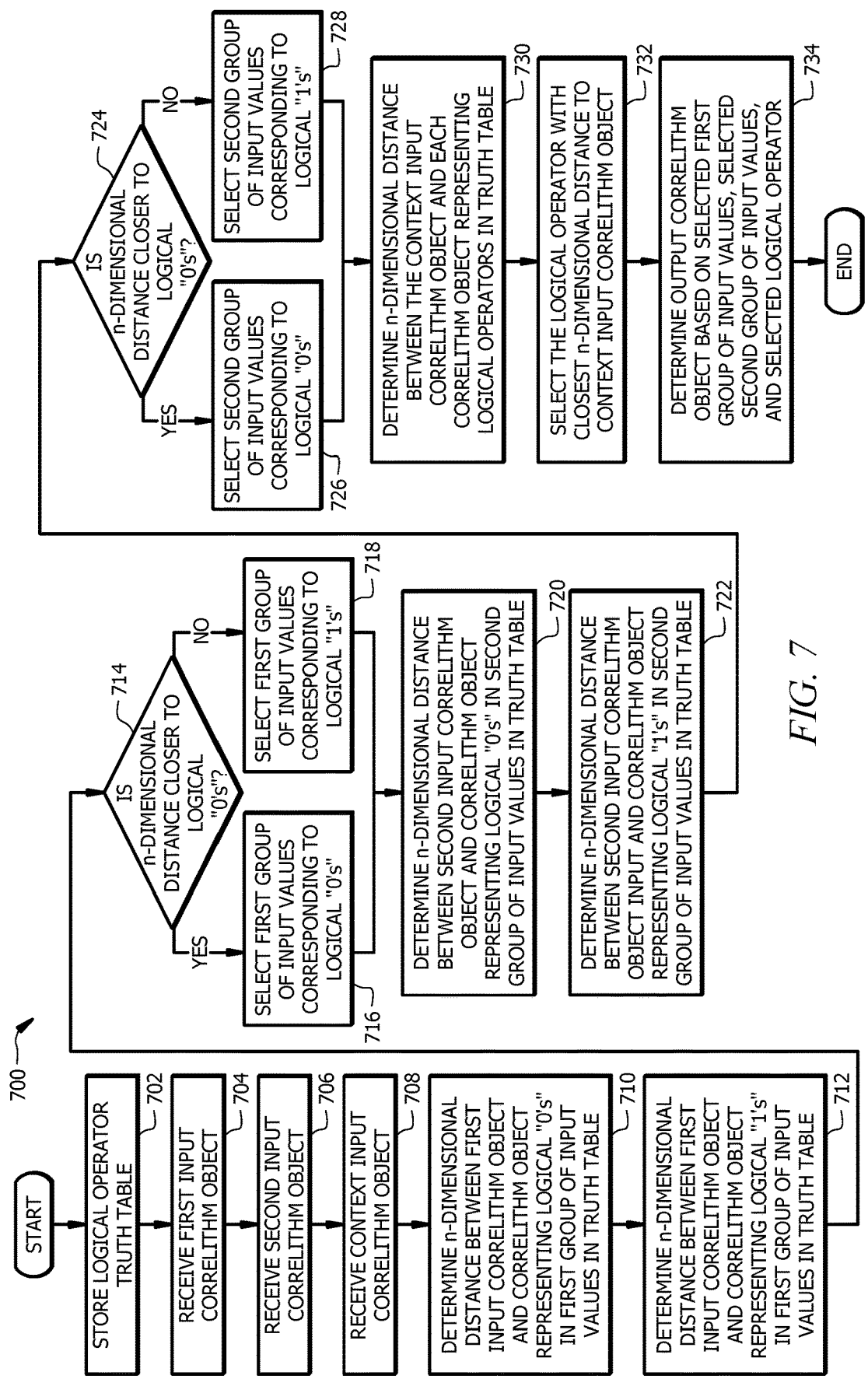
FIG. 7 illustrates one embodiment of a flowchart implementing a process performed by binary logic function gate.

FIG. 7 illustrates one embodiment of a flowchart 700 implementing a process performed by binary correlithm object logic function gate 600 which stores in memory a logical operator truth table 612 at step 702. Logic function gate 600 receives a first input correlithm object 602 at step 704 and a second input correlithm object 604 and step 706. Logic function gate 600 further receives a context input correlithm object 608 at step 708. At step 710, logic function gate 600 determines an n-dimensional distance (e.g., Hamming distance) between first input correlithm object 602 and the correlithm object representing logical "0's" in the first group of input values in truth table 612, such as in the cells where row 614 and columns 620 and 622 intersect in truth table 612 illustrated in FIG. 6. At step 712, logic function gate 600 determines an n-dimensional distance (e.g., Hamming distance) between first input correlithm object 602 and the correlithm object representing logical "1's" in the first group of input values in truth table 612, such as in the cells where row 614 and columns 624 and 626 intersect in truth table 612 illustrated in FIG. 6.

If the n-dimensional distance between first input correlithm object 602 and the correlithm object representing logical "0's" is closer than the n-dimensional distance between first input correlithm object 602 and the correlithm object representing logical "1's," (e.g., smaller Hamming distance) as determined at step 714, then execution proceeds to step 716. Otherwise, execution proceeds to step 718. At step 716, logic function gate 600 selects the logical "0" values, such as the cells where row 614 intersects columns 620 and 622 of truth table 612. At step 718, logic function gate 600 selects the logical "1" values, such as the cells where row 614 intersects columns 624 and 626 of truth table 612.

Execution proceeds to step 720 where logic function gate 600 determines an n-dimensional distance (e.g., Hamming distance) between second input correlithm object 604 and the correlithm object representing logical "0's" in the second group of input values in truth table 612, such as in the cells where row 616 and columns 620 and 624 intersect in truth table 612 illustrated in FIG. 6. At step 722, logic function gate 600 determines an n-dimensional distance (e.g., Hamming distance) between second input correlithm object 604 and the correlithm object representing logical "1's" in the second group of input values in truth table 612, such as in the cells where row 616 and columns 622 and 626 intersect in truth table 612 illustrated in FIG. 6.

If the n-dimensional distance between second input correlithm object 604 and the correlithm object representing logical "0's" is closer than the n-dimensional distance between second input correlithm object 604 and the correlithm object representing logical "1's," (e.g., smaller Hamming distance) as determined at step 724, then execution proceeds to step 726. Otherwise, execution proceeds to step 728. At step 726, logic function gate 600 selects the logical "0" values, such as the cells where row 616 intersects columns 620 and 624 of truth table 612. At step 728, logic function gate 600 selects the logical "1" values, such as the cells where row 616 intersects columns 622 and 626 of truth table 612.

Execution proceeds to step 730 where logic function gate 600 determines the n-dimensional distance (e.g., Hamming distance) between the context input correlithm object 608 and each correlithm object representing logical operators 606 in truth table 612. At step 732, logic function gate 600 selects the logical operator 606 with the closest n-dimensional distance (e.g., smallest Hamming distance) to the context input correlithm object 608. Execution proceeds to step 734 where logic function gate 600 determines output correlithm object 610 based on the logical "0's" or "1's" selected at steps 716 or 718, the logical "0's" or "1's" selected at steps 726 or 728, and the logical operator 606 selected at step 732.

For example, if logical "0's" are selected at steps 716 and 726, then logic function gate 600 determines an appropriate output correlithm object 610 from column 620 of truth table 612 based on the logical operator 606 that is selected at step 612. If logical "1's" are selected at steps 718 and 728, then logic function gate 600 determines an appropriate output correlithm object 610 from column 626 of truth table 612 based on the logical operator 606 that is selected at step 732. If logical "0" is selected at step 716 and logical "1" is selected at step 728, then logic function gate 600 determines an appropriate output correlithm object 610 from column 622 of truth table 612 based on the logical operator 606 that is selected at step 732. If logical "1" is selected at step 718 and logical "0" is selected at step 726, then logic function gate 600 determines an appropriate output correlithm object 610 from column 624 of truth table 612 based on the logical operator 606 that is selected at step 732. Execution terminates at step 736.

Figure 8:
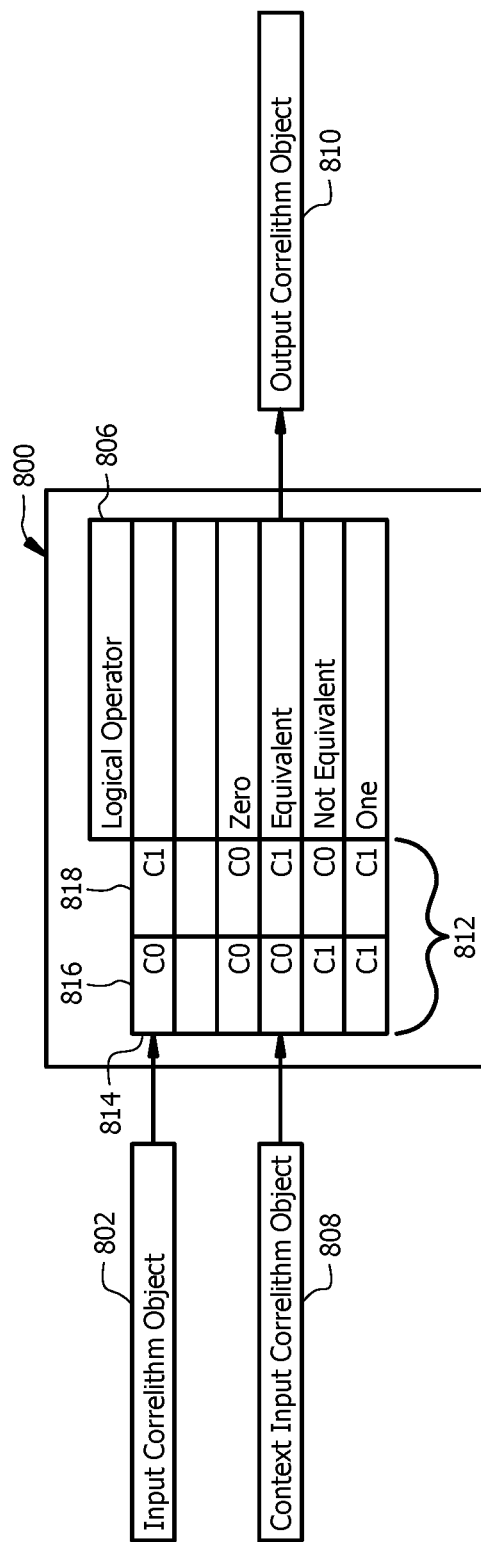
FIG. 8 illustrates one embodiment of a correlithm object unary logic function gate.

FIG. 8 illustrates one embodiment of a unary correlithm object logic function gate 800 that receives an input correlithm object 802, implements a particular logical operator 806 according to a context input correlithm object 808 (in one embodiment), and outputs an output correlithm object 810. Unary correlithm object logic function gate 800 implements up to four different logical operators 806 upon binary values represented by input correlithm object 802. The logical operators 806 are represented by correlithm objects in a truth table 812, an example of which is illustrated in FIG. 8. Depending on the binary values that are input into gate 800 and the portion of the truth table 812 associated with the logical operator 806 that is implemented, gate 800 outputs an output correlithm object 810 representing a logical "0" or "1". In one embodiment, the system will assign the same correlithm object for input 802 to represent a logical "0" as the correlithm object to represent a logical "0" in row 814 of the truth table 812. Further, the system will assign the same correlithm object for input 802 to represent a logical "1" as the correlithm object to represent a logical "1" in row 814 of the truth table 812.

The operation of logic function gate 800 is described below in conjunction with a particular example. In this example, assume that unary correlithm object logic function gate 800 implements only the logical "Equivalent" function or, alternatively in one embodiment, assume that unary correlithm object logic function gate 800 implements a number of logical operators 806 and that correlithm object context input 808 represents a value that selects the "Equivalent" logical operator.

In particular, each of the logical operators 806 are represented by a different, corresponding correlithm object. The context input 808 is also represented by a correlithm object that is set to match the correlithm object of the logical operator 806 to be applied in a particular operation of logic function gate 800. For example, if the Equivalent function is to be applied by logic function gate 800, then the context input 808 is represented by a correlithm object that is set to the same n-bit (e.g., 64-bit) word of binary values as the correlithm object that represents the Equivalent function logical operator 806. When the correlithm object of the context input 808 is received, the logic function gate 800 determines the distance in n-dimensional space between the correlithm object of the context input 808 and each of the correlithm objects representing the logical operators 806. The logic function gate 800 selects for application whichever correlithm object representing a logical operator 806 is closest in n-dimensional space to the correlithm object of the context input 808. For example, in one embodiment, the logic function gate 800 determines the Hamming distance between the correlithm object of the context input 808 and each of the correlithm objects representing the logical operators 806, and selects the logical operator 806 based on which one has the smallest Hamming distance between its correlithm object and the correlithm object of the context input 808. Thus, if the correlithm object of the context input 808 is the closest in n-dimensional space to the correlithm object representing the NAND gate (e.g., has the smallest Hamming distance), then the portion of the truth table 812 that corresponds to the NAND function (e.g., ordered logical values c0, c1) is used by the logic function gate 800 in determining (at least in part) the output 810.

Referring back to the example, further assume that input correlithm object 802 is an n-bit (e.g., 64-bit) correlithm object that represents a logical "0". For example, input correlithm object 802 may comprise a unique n-bit (e.g., 64-bit) word of 1's and 0's that is assigned to represent a logical "0". Logic function gate 800 determines the Hamming distance (or otherwise determines the distance in n-dimensional space) between correlithm object input 802 and the correlithm objects in row 814 of the truth table 812. Even if noise modifies some of the bits of the n-bit input correlithm object 802 and/or some of the bits of the n-bit correlithm objects representing the logical "0" and "1" values in row 814 of the truth table 812, the Hamming distance between the input correlithm object 802 representing a logical "0" and the correlithm object representing a logical "0" in row 814 (shown in the cell where row 614 intersects with column 816 of the truth table 812) will be smaller than the Hamming distance between the correlithm object input 802 representing a logical "0" and the correlithm object representing a logical "1" in row 614 (shown in the cell where row 614 intersects column 818 of the truth table 812). The smaller Hamming distance calculation means that the correlithm object for input 802 is closer in n-dimensional space to the correlithm object representing a logical "0" in row 814 than to the correlithm object representing a logical "1" in row 814. Thus, column 816 is selected as a match for correlithm object input 802 based upon these Hamming distance calculations.

According to this input 802 and upon implementing the Equivalent function, the resulting binary value is "0". Output correlithm object 810 may comprise a unique n-bit (e.g., 64-bit) word of 1's and 0's that is assigned to represent this logical "0." Conversely, if input correlithm object 802 had represented a logical "1," then column 818 would have been selected based upon the Hamming distance calculations, and upon implementing the Equivalent function, the resulting binary value would be a logical "1". Output correlithm object 810 may comprise a unique n-bit (e.g., 64-bit) word of 1's and 0's that is assigned to represent the logical "1" in this instance. In this way, the logic function gate 800 can implement the logical operators associated with truth table 812 using correlithm objects rather than traditional voltage values to represent logical "0's" and "1's." Although the above example describes an Equivalent function, one of skill in the art will recognize that any of the logical operators 806 illustrated in FIG. 8 can be implemented either by building a logic function gate 800 dedicated to that logical operator 806, or by using a context input 808 to identify a particular logical operator 806 in a multi-faceted logic function gate 800.

Implementing one or more logical operators 806 using correlithm objects, as described above, improves the operation of any electrical or computer system that uses such a logic gate 800. In particular, whereas a zero voltage that may represent a logical "0" in a conventional logic gate for a traditional computer system may be altered by a significant noise event (e.g., voltage surge caused by EMP) such that the logical value misrepresents the logical "0" as a logical "1" (or vice versa), the n-bit word of 1's and 0's that forms the input correlithm object 802 would remain largely unaffected by the noise. In particular, perhaps a few of the bits of the n-bit input correlithm object 802 would be affected by noise. Or, perhaps a few of the bits of the n-bit correlithm object values in the truth table 812 would be affected by the noise. However, the remaining bits of the n-bit input correlithm object 802 (or correlithm objects representing values in the truth table 812) would remain close enough to the core of the original input correlithm object 802 (or correlithm objects representing values in the truth table 812) to accurately represent the original logical value. Thus, upon calculating the Hamming distance between the input correlithm object 802 with the correlithm objects representing logical "0's" or "1's" in row 814, the system would associate the input correlithm object 802 with the correct values in the truth table 812 with a greater degree of likelihood than in conventional computer systems that experience a significant noise event. Similarly, a significant noise event would not significantly affect the output correlithm object 810 either. In particular, perhaps a few of the bits of the n-bit output correlithm object 810 would be affected by noise. However, the remaining bits of the n-bit output correlithm object 810 would remain close enough to the core of the output original correlithm object 810 to accurately represent the original logical value of "1." In this way, the implementation of a correlithm object logic function gate 800 improves the operation of the underlying electronic circuit or computer in comparison to conventional approaches of implementing logic gates. In one embodiment, a different n-bit correlithm object is used to represent a logical "0" or logical "1" in output 810 than is used in either input 802.

Figure 9:
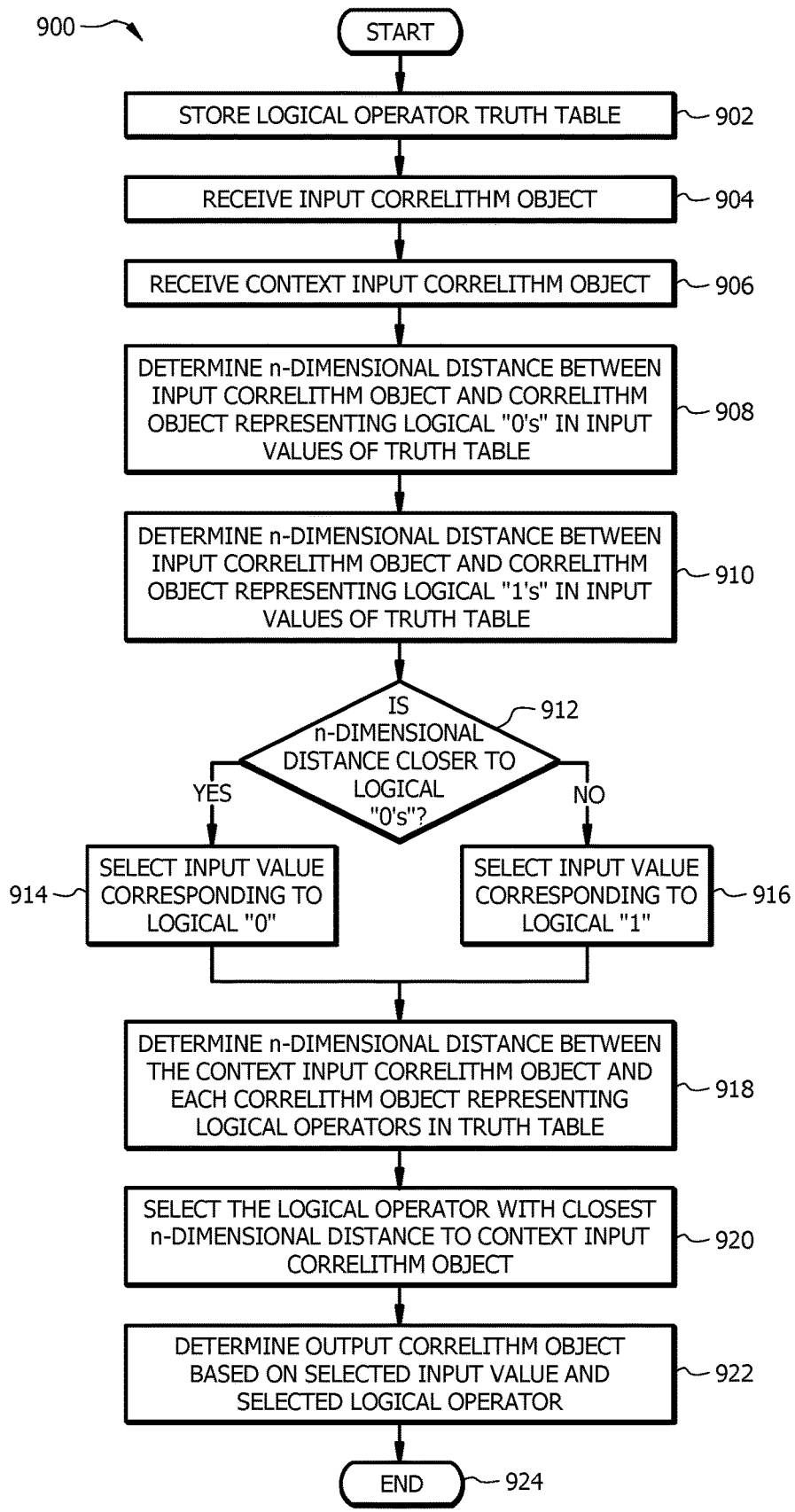
FIG. 9 illustrates one embodiment of a flowchart implementing a process performed by unary logic function gate.

FIG. 9 illustrates one embodiment of a flowchart 900 implementing a process performed by unary logic function gate 800 which stores in memory a logical operator truth table 812 at step 902. Logic function gate 800 receives an input correlithm object 802 at step 804 and a context input correlithm object 808 at step 906. At step 908, logic function gate 800 determines an n-dimensional distance (e.g., Hamming distance) between input correlithm object 802 and the correlithm object representing a logical "0" in the input values of truth table 812, such as in the cell where row 814 and column 816 intersects in truth table 812 illustrated in FIG. 8. At step 910, logic function gate 800 determines an n-dimensional distance (e.g., Hamming distance) between input correlithm object 802 and the correlithm object representing a logical "1" in the input values of truth table 612, such as in the cell where row 814 and column 818 intersects in truth table 812 illustrated in FIG. 6.

If the n-dimensional distance between input correlithm object 802 and the correlithm object representing a logical "0" is closer than the n-dimensional distance between input correlithm object 802 and the correlithm object representing a logical "1," (e.g., smaller Hamming distance) as determined at step 912, then execution proceeds to step 914. Otherwise, execution proceeds to step 916. At step 918, logic function gate 800 selects the logical "0" value, such as the cell where row 814 intersects column 816 of truth table 812. At step 916, logic function gate 800 selects the logical "1" value, such as the cell where row 814 intersects column 818 of truth table 812.

Execution proceeds to step 918 where logic function gate 800 determines the n-dimensional distance (e.g., Hamming distance) between the context input correlithm object 808 and each correlithm object representing logical operators 806 in truth table 812. At step 920, logic function gate 800 selects the logical operator 806 with the closest n-dimensional distance (e.g., smallest Hamming distance) to the context input correlithm object 808. Execution proceeds to step 922 where logic function gate 800 determines output correlithm object 810 based on the logical "0" or "1" selected at steps 914 or 916, and the logical operator 806 selected at step 920.

For example, if a logical "0" is selected at step 914, then logic function gate 800 determines an appropriate output correlithm object 810 from column 816 of truth table 812 based on the logical operator 806 that is selected at step 920. If a logical "1" is selected at step 916, then logic function gate 800 determines an appropriate output correlithm object 810 from column 818 of truth table 812 based on the logical operator 806 that is selected at step 920. Execution terminates at step 924.

Figure 10:
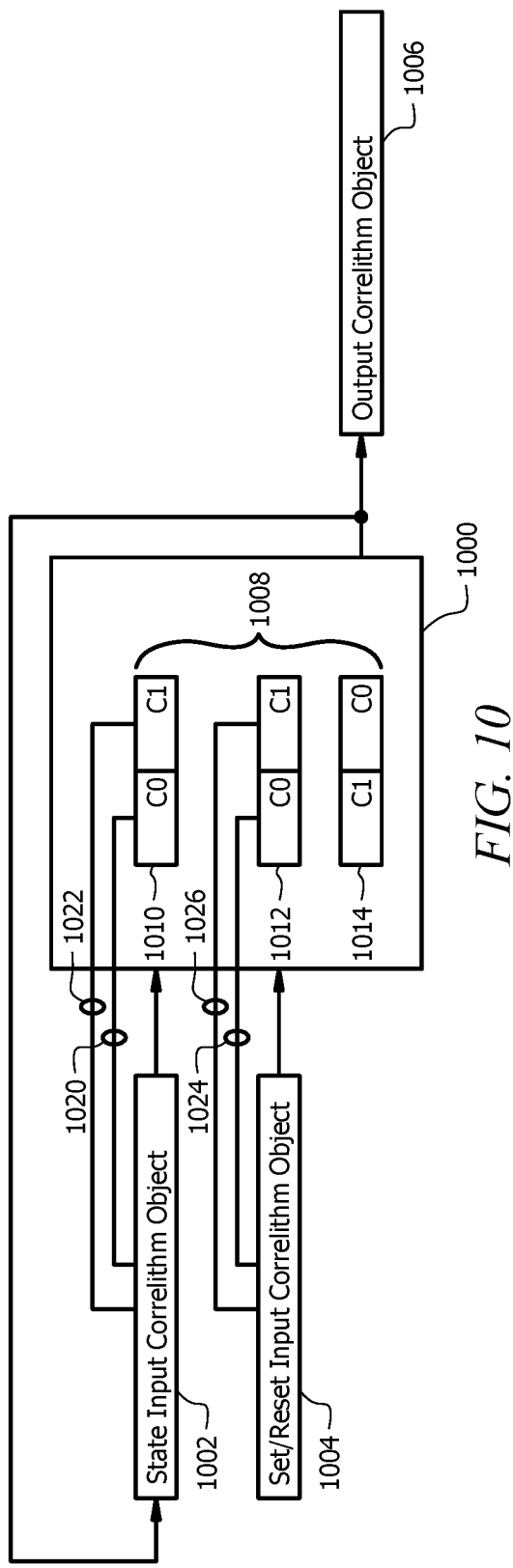
FIG. 10 illustrates one embodiment of a correlithm object binary flip-flop device.

FIG. 10 illustrates one embodiment of a binary correlithm object flip-flop device 1000 that receives a state input correlithm object 1002 and a set/reset correlithm object 1004, and outputs an output correlithm object 1006, which is returned as feedback to device 1000 as state input correlithm object 1002. Device 1000 implements a truth table 1008 that has two stable states and can be used to store state information for device 1000. Depending on the current state of device 1000, the binary values that are input into device 1000, and their relationship in n-dimensional space to the logical values stored in truth table 1008, device 1000 outputs output correlithm object 1006 representing a logical state (e.g., logical "0" or logical "1").

In one embodiment, the system will assign the same correlithm object for input 1002 to represent a logical "0" as the correlithm object to represent a logical "0" in row 1010 of the truth table 1008. Further, the system will assign the same correlithm object for input 1002 to represent a logical "1" as the correlithm object to represent a logical "1" in row 1010 of the truth table 1008. Similarly, the system will assign the same correlithm object for input 1004 to represent a logical "0" as the correlithm object to represent a logical "0" in row 1012 of the truth table 1008. Further, the system will assign the same correlithm object for input 1004 to represent a logical "1" as the correlithm object to represent a logical "1" in row 1012 of the truth table 1008.

Each of the correlithm objects described in conjunction with device 1000 are n-bit digital words comprising binary values. However, the set/reset input correlithm object 1004 and the corresponding correlithm objects in row 1012 of the truth table 1008 are larger n-bit digital words than the state input correlithm object 1002 and the corresponding correlithm objects in row 1010 of truth table 1008. For example, in one embodiment, the set/reset input correlithm object 1004 and the corresponding correlithm objects in row 1012 of the truth table 1008 are 128-bit digital words whereas the state input correlithm object 1002 and the corresponding correlithm objects in row 1010 of truth table 1008 are 64-bit digital words. As a result, the device 1000 allocates more weight to the logical value of the set/reset input correlithm object 1004 than the logical value of state input correlithm object 1002 when determining the appropriate state of device 1000, as described in detail below.

The operation of binary correlithm object flip-flop device 1000 is described below in conjunction with a particular, non-limiting example. At the outset of the example operation, the state of the device 1000 as represented by state input correlithm object 1002 is non-determinative: it can be a logical "0" or a logical "1." For purposes of this example, however, assume it is a logical "1." Further assume that the set/reset input correlithm object 1004 represents a logical "0." Device 1000 receives both the state input correlithm object 1002 and the set/reset input correlithm object 1004.

Device 1000 determines the distance in n-dimensional space between the state input correlithm object 1002 (representing logical "1" in this example) and the correlithm object representing a logical "0" in row 1010 of the truth table 1008. In a particular embodiment, this distance in n-dimensional space is represented by determining a Hamming distance 1020 between the binary values of state input correlithm object 1002 and the binary values of the correlithm object representing a logical "0" in row 1010 of the truth table 1008. Device 1000 then determines a Hamming distance 1022 between state input correlithm object 1002 (representing logical "1" in this example) and the correlithm object representing a logical "1" in row 1010 of the truth table 1008.

If the state of the device 1000 as represented by state input correlithm object 1002 is a logical "0," then the Hamming distance 1020 between it and the correlithm object representing a logical "0" in row 1010 of the truth table 1008 will be very small, trending to zero depending on how much noise has altered the binary values of either the state input correlithm object 1002 and/or the the correlithm object representing a logical "0" in row 1010 of the truth table 1008. Conversely, the Hamming distance 1022 between it and the correlithm object representing a logical "1" in row 1010 of the truth table 1008 will be large, trending to "n" for an n-bit correlithm object 1002 (e.g., Hamming distance 1022 trends to 64 for a 64-bit correlithm object 1002). If the state of the device 1000 as represented by state input correlithm object 1002 is a logical "1," (as it is in this particular example) then the Hamming distance calculations 1020 and 1022 will be reversed. In particular, the Hamming distance 1020 between state input correlithm object 1002 (representing logical "1" in this example) and the correlithm object representing a logical "0" in row 1010 of the truth table 1008 will trend toward "n" for an n-bit correlithm object 1002; and the Hamming distance 1022 between state input correlithm object 1002 (representing logical "1" in this example) and the correlithm object representing a logical "1" in row 1010 of the truth table 1008 will trend toward zero depending on the amount of noise, as described above.

Device 1000 also determines the Hamming distance 1024 between the set/reset input correlithm object 1004 and the correlithm object representing a logical "0" in row 1012 of the truth table 1008; and the Hamming distance 1026 between set/reset input correlithm object 1004 and the correlithm object representing a logical "1" in row 1012 of the truth table 1008. If set/reset input correlithm object 1004 represents a logical "0," (as it is in this particular example), then the Hamming distance 1024 between it and the correlithm object representing a logical "0" in row 1012 of the truth table 1008 will be very small, trending to zero depending on how much noise has altered the binary values of either the set/reset input correlithm object 1004 and/or the correlithm object representing a logical "0" in row 1012 of the truth table 1008. Conversely, the Hamming distance 1026 between it and the correlithm object representing a logical "1" in row 1012 of the truth table 1008 will be large, trending to "n" for an n-bit correlithm object 1002 (e.g., Hamming distance 1026 will be trending to 128 for a 128-bit correlithm object 1004).

The Hamming distances 1020 and 1024 between the correlithm objects 1002 and 1004 and their corresponding correlithm objects representing logical "0's" in truth table 1008, respectively, are added together; and the Hamming distances 1022 and 1026 between the correlithm objects 1002 and 1004 and their corresponding correlithm objects representing logical "1's" in truth table 1008, respectively, are also added together. The output correlithm object 1006 is set to represent a logical "0" if the addition of the Hamming distances 1020 and 1024 for the logical "0" values is less than the addition of the Hamming distances 1022 and 1026 for the logical "1" values. Conversely, the output correlithm object 1006 is set to represent a logical "1" if the addition of the Hamming distances 1022 and 1026 for the logical "1" values is less than the addition of the Hamming distances 1020 and 1024 for the logical "0" values.

In the example above where the state input correlithm object 1002 was a logical "1" and the set/reset input correlithm object was a logical "0," the Hamming distance 1020 trended to 64, the Hamming distance 1022 trended to zero, the Hamming distance 1024 trended to zero, and the Hamming distance 1026 trended to 128. Thus, the addition of Hamming distances 1020 and 1024 (e.g., 64+0=64) was less than the addition of Hamming distances 1022 and 1026 (e.g., 0+128=128). Therefore, output correlithm object 1006 is set to a logical "0" value. In this way, the state of the device 1000 was flipped from a logical "1" value to a logical "0" value.

Because the set/reset input correlithm object 1004 is a larger n-bit digital word than state input correlithm object 1002 (e.g., 128-bit versus 64-bit), device 1000 effectively gives more weight to the Hamming distances 1024 and 1026 for reset input correlithm object 1004 than the Hamming distances 1020 and 1022 for the state input correlithm object 1002. For example, the Hamming distance 1026 between the set/reset input correlithm object 1004 (representing logical "0" in this example) and the correlithm object representing logical "1" in row 1012 of truth table 1008 is 128, whereas the Hamming distance 1020 between the state input correlithm object 1002 (representing logical "1" in this example) and the correlithm object representing logical "0" in row 1010 of truth table 1008 is 64. By applying more weight to the set/reset input correlithm object 1004 than state input correlithm object 1002 in determining the logical value of output correlithm object 1006, device 1000 is permitted to change states.

Continuing with the example, the correlithm object output 1006 representing a logical "0" is fed back to device 1000 as state input correlithm object 1002. In the continuation of this example, set/reset input correlithm object 1004 still represents a logical "0" value. With the state input correlithm object 1002 now representing a logical "0" instead of the previous logical "1," the Hamming distance 1020 trends to zero and the Hamming distance 1022 trends to 64. The Hamming distance 1024 remains trending to zero and the Hamming distance 1026 remains trending to 128. The addition of Hamming distances 1020 and 1024 (e.g., 0+0=0) is less than the addition of Hamming distances 1022 and 1026 (e.g., 64+128=192). Thus, the correlithm object output 1006 remains a logical "0" value. In effect, the state of device 1000 has latched to a logical "0" value.

From here, if the set/reset input correlithm object 1004 is changed to a logical "1" value, then the state of the device 1000 will change to a logical "1" value. In particular, with the state input correlithm object 1002 still representing a logical "0," the Hamming distance 1020 trends to zero and the Hamming distance 1022 trends to 64. However, the Hamming distance 1024 now trends to 128 and the Hamming distance 1026 now trends to zero. Thus, the addition of Hamming distances 1022 and 1026 (e.g., 64+0=64) is less than the addition of Hamming distances 1020 and 1024 (e.g., 0+128=128). Thus, the output correlithm object 1006 changes to a logical "1" value.

Once again, the correlithm object output 1006 representing a logical "1" is fed back to device 1000 as state input correlithm object 1002. In the continuation of this example, set/reset input correlithm object 1004 still represents a logical "1" value. With the state input correlithm object 1002 now representing a logical "1" instead of the previous logical "0," the Hamming distance 1020 trends to 64 and the Hamming distance 1022 trends to zero. The Hamming distance 1024 remains trending to 128 and the Hamming distance 1026 remains trending to zero. The addition of Hamming distances 1022 and 1026 (e.g., 0+0=0) is less than the addition of Hamming distances 1020 and 1024 (e.g., 64+128=192). Thus, the correlithm object output 1006 remains a logical "1" value. In effect, the state of device 1000 has latched to a logical "1" value.

While several embodiments have been provided in the present disclosure, it should be understood that the disclosed systems and methods might be embodied in many other specific forms without departing from the spirit or scope of the present disclosure. The present examples are to be considered as illustrative and not restrictive, and the intention is not to be limited to the details given herein. For example, the various elements or components may be combined or integrated in another system or certain features may be omitted, or not implemented.

In addition, techniques, systems, subsystems, and methods described and illustrated in the various embodiments as discrete or separate may be combined or integrated with other systems, modules, techniques, or methods without departing from the scope of the present disclosure. Other items shown or discussed as coupled or directly coupled or communicating with each other may be indirectly coupled or communicating through some interface, device, or intermediate component whether electrically, mechanically, or otherwise. Other examples of changes, substitutions, and alterations are ascertainable by one skilled in the art and could be made without departing from the spirit and scope disclosed herein.

To aid the Patent Office, and any readers of any patent issued on this application in interpreting the claims appended hereto, applicants note that they do not intend any of the appended claims to invoke 35 U.S.C. § 112(f) as it exists on the date of filing hereof unless the words "means for" or "step for" are explicitly used in the particular claim.

The invention claimed is:

1. A device configured to emulate a correlithm object flip-flop logic gate, comprising:
   a memory operable to store a flip-flop logic gate truth table, the truth table comprising:
      a state input logical zero value represented by a first correlithm object;
      a state input logical one value represented by a second correlithm object;
      a set/reset input logical zero value represented by a third correlithm object;
      a set/reset input logical one value represented by a fourth correlithm object;

an output logical zero value represented by the first correlithm object; and an output logical one value represented by the second correlithm object;

a logic engine communicatively coupled to the memory and configured to:

receive a state input correlithm object;

receive a set/reset input correlithm object;

determine a first Hamming distance between the state input correlithm object and the first correlithm object;

determine a second Hamming distance between the state input correlithm object and the second correlithm object;

determine a third Hamming distance between the set/reset input correlithm object and the third correlithm object;

determine a fourth Hamming distance between the set/reset input correlithm object and the fourth correlithm object;

add the first Hamming distance and the third Hamming distance;

add the second Hamming distance and the fourth Hamming distance;

output the first correlithm object representing the output logical zero value if the addition of the first Hamming distance and the third Hamming distance is less than the addition of the second Hamming distance and the fourth Hamming distance; and output the second correlithm object representing the output logical one value if the addition of the second Hamming distance and the fourth Hamming distance is less than the addition of the first Hamming distance and the third Hamming distance.

2. The device of claim 1, wherein each of the correlithm objects comprises an n-bit digital word of binary values.

3. The device of claim 2, wherein the third and fourth correlithm objects representing the set/reset input comprise a larger n-bit digital word than the first and second correlithm objects representing the state input.

4. The device of claim 3, wherein the third and fourth correlithm objects representing the set/reset input comprise a 128-bit digital word and the first and second correlithm objects representing the state input comprise a 64-bit digital word.

5. The device of claim 1, wherein the output logical zero value represented by the first correlithm object is fed back to the flip-flop logic gate as the state input correlithm object.

6. The device of claim 1, wherein the output logical one value represented by the second correlithm object is fed back to the flip-flop logic gate as the state input correlithm object.

7. A method for emulating a correlithm object flip-flop logic gate, comprising:

storing a flip-flop logic gate truth table, the truth table comprising:

a state input logical zero value represented by a first correlithm object;

a state input logical one value represented by a second correlithm object;

a set/reset input logical zero value represented by a third correlithm object;

a set/reset input logical one value represented by a fourth correlithm object;

an output logical zero value represented by the first correlithm object; and an output logical one value represented by the second correlithm object;

receiving a state input correlithm object;

receiving a set/reset input correlithm object;

determining a first Hamming distance between the state input correlithm object and the first correlithm object;

determining a second Hamming distance between the state input correlithm object and the second correlithm object;

determining a third Hamming distance between the set/reset input correlithm object and the third correlithm object;

determining a fourth Hamming distance between the set/reset input correlithm object and the fourth correlithm object;

adding the first Hamming distance and the third Hamming distance;

adding the second Hamming distance and the fourth Hamming distance;

outputting the first correlithm object representing the output logical zero value if the addition of the first Hamming distance and the third Hamming distance is less than the addition of the second Hamming distance and the fourth Hamming distance; and outputting the second correlithm object representing the output logical one value if the addition of the second Hamming distance and the fourth Hamming distance is less than the addition of the first Hamming distance and the third Hamming distance.

8. The method of claim 7, wherein each of the correlithm objects comprises an n-bit digital word of binary values.

9. The method of claim 8, wherein the third and fourth correlithm objects representing the set/reset input comprise a larger n-bit digital word than the first and second correlithm objects representing the state input.

10. The method of claim 9, wherein the third and fourth correlithm objects representing the set/reset input comprise a 128-bit digital word and the first and second correlithm objects representing the state input comprise a 64-bit digital word.

11. The method of claim 7, wherein the output logical zero value represented by the first correlithm object is fed back to the flip-flop logic gate as the state input correlithm object.

12. The method of claim 7, wherein the output logical one value represented by the second correlithm object is fed back to the flip-flop logic gate as the state input correlithm object.

13. A device configured to emulate a correlithm object flip-flop logic gate, comprising:

a memory operable to store a flip-flop logic gate truth table, the truth table comprising:

a first state input logical value represented by a first correlithm object;

a second state input logical value represented by a second correlithm object;

a first set/reset input logical value represented by a third correlithm object;

a second set/reset input logical value represented by a fourth correlithm object;

a first output logical value represented by the first correlithm object; and a second output logical value represented by the second correlithm object;

a logic engine communicatively coupled to the memory and configured to:

receive a state input correlithm object;

receive a set/reset input correlithm object;

determine a first Hamming distance between the state input correlithm object and the first correlithm object;

determine a second Hamming distance between the state input correlithm object and the second correlithm object;

determine a third Hamming distance between the set/reset input correlithm object and the third correlithm object;

determine a fourth Hamming distance between the set/reset input correlithm object and the fourth correlithm object;

add the first Hamming distance and the third Hamming distance;

add the second Hamming distance and the fourth Hamming distance;

output the first correlithm object representing the first output logical value if the addition of the first Hamming distance and the third Hamming distance is less than the addition of the second Hamming distance and the fourth Hamming distance; and output the second correlithm object representing the second output logical value if the addition of the second Hamming distance and the fourth Hamming distance is less than the addition of the first Hamming distance and the third Hamming distance.

14. The device of claim 13, wherein each of the correlithm objects comprises an n-bit digital word of binary values.

15. The device of claim 14, wherein the third and fourth correlithm objects representing the set/reset input comprise a larger n-bit digital word than the first and second correlithm objects representing the state input.

16. The device of claim 15, wherein the third and fourth correlithm objects representing the set/reset input comprise a 128-bit digital word and the first and second correlithm objects representing the state input comprise a 64-bit digital word.

17. The device of claim 13, wherein the first output logical value represented by the first correlithm object is fed back to the flip-flop logic gate as the state input correlithm object.

18. The device of claim 13, wherein the second output logical value represented by the second correlithm object is fed back to the flip-flop logic gate as the state input correlithm object.

19. The device of claim 13, wherein:
the first state input logical value represented by a first correlithm object is a logical zero value;
the second state input logical value represented by a second correlithm object is a logical one value;
the first set/reset input logical value represented by a third correlithm object is a logical zero value;
the second set/reset input logical value represented by a fourth correlithm object is a logical one value;
the first output logical value represented by the first correlithm object is a logical zero value; and
the second output logical value represented by the second correlithm object is a logical one value.

20. The device of claim 13, wherein:
the first state input logical value represented by a first correlithm object is a logical one value;
the second state input logical value represented by a second correlithm object is a logical zero value;
the first set/reset input logical value represented by a third correlithm object is a logical one value;
the second set/reset input logical value represented by a fourth correlithm object is a logical zero value;
the first output logical value represented by the first correlithm object is a logical one value; and
the second output logical value represented by the second correlithm object is a logical zero value.

* * * * *